United States Patent
Yu et al.

(10) Patent No.: US 12,507,572 B2
(45) Date of Patent: Dec. 23, 2025

(54) DISPLAY PANEL AND METHOD FOR MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chi Yu, Beijing (CN); Weiyun Huang, Beijing (CN); Bo Shi, Beijing (CN); Yangpeng Wang, Beijing (CN); Baolei Huo, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 858 days.

(21) Appl. No.: 17/638,297

(22) PCT Filed: Jan. 4, 2021

(86) PCT No.: PCT/CN2021/070183
§ 371 (c)(1),
(2) Date: Feb. 25, 2022

(87) PCT Pub. No.: WO2022/141643
PCT Pub. Date: Jul. 7, 2022

(65) Prior Publication Data
US 2023/0165110 A1    May 25, 2023

(51) Int. Cl.
*H10K 59/80* (2023.01)
*H10K 59/12* (2023.01)
*H10K 59/126* (2023.01)

(52) U.S. Cl.
CPC ... *H10K 59/80515* (2023.02); *H10K 59/1201* (2023.02); *H10K 59/126* (2023.02); *H10K 59/80521* (2023.02); *H10K 59/80524* (2023.02)

(58) Field of Classification Search
CPC .......... H10K 59/80515; H10K 50/813; H10K 59/80521; H10K 50/822; H10K 59/8052;
(Continued)

(56) References Cited

U.S. PATENT DOCUMENTS

| | | | |
|---|---|---|---|
| 10,756,136 | B1 | 8/2020 | Ma et al. |
| 2017/0200773 | A1 | 7/2017 | Li et al. |

(Continued)

FOREIGN PATENT DOCUMENTS

| | | |
|---|---|---|
| CN | 110618557 A | 12/2019 |
| CN | 111785742 A | 10/2020 |
| KR | 20190054563 A | 5/2019 |

OTHER PUBLICATIONS

Chinese First Office Action (w/ English translation) for corresponding Chinese Application No. 202111328787.0, dated Sep. 14, 2022, 16 pages.

(Continued)

*Primary Examiner* — Julio J Maldonado
*Assistant Examiner* — Nathan Pridemore
(74) *Attorney, Agent, or Firm* — Dority & Manning, P.A.

(57) ABSTRACT

A display panel has a display area including a light-transmissive area. The display panel includes a substrate, and a plurality of shielding patterns, a plurality of light-emitting layers and a plurality of cathodes that are disposed in the light-transmissive area and on the substrate. Orthogonal projections of the plurality of shielding patterns on the substrate are separated from each other. Each light-emitting layer and a respective cathode constitute a portion of a (Continued)

light-emitting device. The light-emitting device has an active light-emitting area. An orthogonal projection of the active light-emitting area on the substrate is located within an orthogonal projection of a cathode of the light-emitting device on the substrate. The plurality of cathode is located at a side of a respective shielding patterns away from the substrate. An orthogonal projection of the shielding pattern on the substrate covers the orthogonal projection of the cathode on the substrate.

20 Claims, 18 Drawing Sheets

(58) Field of Classification Search
CPC ............... H10K 50/828; H10K 50/824; H10K 59/8792; H10K 50/126; H10K 59/80522; H10K 71/621
See application file for complete search history.

(56) References Cited

U.S. PATENT DOCUMENTS

| | | |
|---|---|---|
| 2019/0006627 A1* | 1/2019 | Li .................... H10K 50/858 |
| 2019/0354740 A1 | 11/2019 | Li et al. |
| 2020/0135972 A1 | 4/2020 | Ma et al. |
| 2021/0408194 A1 | 12/2021 | Zhang |
| 2022/0005906 A1* | 1/2022 | Jeong .................... H10K 71/00 |
| 2022/0069028 A1* | 3/2022 | Jang .................... H10K 59/121 |
| 2022/0155831 A1 | 5/2022 | Sun et al. |
| 2022/0158140 A1 | 5/2022 | Liu et al. |

OTHER PUBLICATIONS

PCT International Search Report (w/ English translation) and Written Opinion for corresponding PCT Application No. PCT/CN2021/070183, dated Oct. 9, 2021, 10 pages.

* cited by examiner

F-F

DISPLAY PANEL AND METHOD FOR MANUFACTURING THE SAME, AND DISPLAY APPARATUS

CROSS-REFERENCE TO RELATED APPLICATION

This application is a national phase entry under 35 USC 371 of International Patent Application No. PCT/CN2021/070183, filed on Jan. 4, 2021, which is incorporated herein by reference in its entirety.

TECHNICAL FIELD

The present disclosure relates to the field of display technologies, and in particular, to a display panel and a method for manufacturing the same, and a display apparatus.

BACKGROUND

With the increase of people's requirements for visual experience, in order to improve a visual effect of a display screen, it is necessary to increase a proportion of a display area in the display screen as much as possible, i.e., to increase a screen-to-body ratio of the display screen. A display screen with a screen-to-body ratio of 100% or approximately 100% is generally referred to as a "full screen".

To achieve a design of the "full screen", a front camera needs to be disposed on a back side of the display screen (i.e., a side opposite to a light-exit side of the display screen). When working, the front camera needs enough amount of light input to take a clear picture. Therefore, a light transmittance of an area corresponding to the front camera of the display screen is required to be relatively high.

SUMMARY

In an aspect, a display panel is provided. The display panel has a display area including a light-transmissive area and a main display area located at a periphery of the light-transmissive area. The display panel includes a substrate, a plurality of shielding patterns, a plurality of light-emitting layers and a plurality of cathodes. The plurality of shielding patterns are disposed on the substrate and located in the light-transmissive area, and orthogonal projections of the plurality of shielding patterns on the substrate are separated from each other. The plurality of light-emitting layers are disposed in the light-transmissive area and on the substrate. The plurality of cathodes are disposed in the light-transmissive area and located on a side of the plurality of light-emitting layers away from the substrate. Each light-emitting layer and a respective cathode constitute a portion of a light-emitting device. The light-emitting device has an active light-emitting area, and an orthogonal projection of the active light-emitting area on the substrate is located within an orthogonal projection of a cathode of the light-emitting device on the substrate. The cathode is located at a side of a respective shielding pattern away from the substrate. An orthogonal projection of the shielding pattern on the substrate covers the orthogonal projection of the cathode on the substrate.

In some embodiments, a transmittance of the cathode to visible light is greater than a transmittance of the cathode to infrared light; and a transmittance of the shielding pattern to infrared light is less than or equal to 2%.

In some embodiments, the shielding pattern is located on a side of the light-emitting layer proximate to the substrate, and the shielding pattern is further used as an anode of the light-emitting device.

In some embodiments, the display panel further includes a plurality of anodes disposed in the light-transmissive area and located on a side of the plurality of light-emitting layers proximate to the substrate. The plurality of shielding patterns are located at a side of the plurality of anodes proximate to the substrate. The orthogonal projection of the shielding pattern on the substrate is at least partially overlapped with an orthogonal projection of a respective anode on the substrate.

In some embodiments, the display panel further includes a semiconductor layer, a gate metal layer and a source-drain metal layer. The semiconductor layer is located between the substrate and the plurality of anodes. The gate metal layer is located between the substrate and the plurality of anodes. The source-drain metal layer is farther away from the substrate than the semiconductor layer and the gate metal layer, and is located on the side of the plurality of anodes proximate to the substrate. The shielding patterns are located in the semiconductor layer or the gate metal layer or the source-drain metal layer.

In some embodiments, a transmittance of the shielding pattern to visible light is greater than a transmittance of the shielding pattern to infrared light; and a thickness of the shielding pattern is greater than a thickness of the cathode.

In some embodiments, a material of the cathode includes a magnesium-silver alloy, and a material of the shielding pattern includes silver.

In some embodiments, the cathode includes a cathode body portion and a cathode connection portion. The orthogonal projection of the anode on the substrate covers an orthogonal projection of the cathode body portion on the substrate. The cathode connection portion is electrically connected to the cathode body portion, and an orthogonal projection of the cathode connection portion on the substrate is not overlapped with the orthogonal projection of the anode on the substrate.

In some embodiments, the shielding pattern includes a shielding pattern body portion and a shielding pattern connection portion. An orthogonal projection of the shielding pattern body portion on the substrate covers the orthogonal projection of the cathode body portion on the substrate. The shielding pattern connection portion is connected to the shielding pattern body portion, and an orthogonal projection of the shielding pattern connection portion on the substrate covers the orthogonal projection of the cathode connection portion on the substrate.

In some embodiments, the display panel further includes a transparent conductive layer and a first insulating layer. The transparent conductive layer is located between a film layer in which the plurality of shielding patterns are located and the plurality of anodes, and the first insulating layer is located between the transparent conductive layer and the plurality of cathodes. A plurality of first via holes are provided in the first insulating layer, and a gap exists between an orthogonal projection of each first via hole on the substrate and an orthogonal projection of an adjacent anode on the substrate. The orthogonal projection of the first via hole on the substrate is located within an orthogonal projection of a respective cathode connection portion on the substrate. Each cathode is electrically connected to the transparent conductive layer through at least one first via hole.

In some embodiments, the display panel further includes at least one cathode connection structure made of a same material as the cathode and disposed in a same layer as the cathode. A dimension of the cathode connection structure in a first direction is greater than a dimension of the cathode connection structure in a second direction. Each cathode connection structure is electrically connected to two cathodes adjacent to the cathode connection structure. The first direction is a row direction in which a plurality of sub-pixels of the display panel are arranged, and the second direction is a column direction in which the plurality of sub-pixels of the display panel are arranged.

In some embodiments, the at least one cathode connection structure includes a plurality of cathode connection structures arranged in a plurality of rows, and each row includes cathode connection structures arranged in the first direction. Each row of cathode connection structures and portions of cathodes connected to the cathode connection structures in the row constitute a cathode connection strip. In the second direction, the cathode connection strip has substantially a same dimension as each cathode connection structure.

In some embodiments, the display panel further includes a plurality of shielding connection structures arranged in a plurality of rows. The plurality of shielding connection structures are made of a same material as the plurality of shielding patterns and disposed in a same layer as the plurality of shielding patterns. Each row includes shielding connection structures arranged in the first direction. Each row of shielding connection structures and portions of shielding patterns connected to the shielding connection structures in the row constitute a shielding connection strip. The display panel includes a plurality of cathode connection strips. An orthogonal projection of the shielding connection strip on the substrate covers an orthogonal projection of a respective cathode connection strip on the substrate.

In some embodiments, the anode includes a first anode portion and a second anode portion. A shape of the first anode portion is substantially the same as a shape of the active light-emitting area of the light-emitting device, and a border of the first anode portion is partially overlapped with a border of the anode. The second anode portion is electrically connected to the first anode portion. The cathode includes a first cathode portion and a second cathode portion. An orthogonal projection of the first cathode portion on the substrate is covered by an orthogonal projection of the first anode portion on the substrate. The second cathode portion is electrically connected to the first cathode portion. An orthogonal projection of the second cathode portion on the substrate is covered by an orthogonal projection of the second anode portion on the substrate.

In some embodiments, the display panel further includes a pixel circuit layer, a second insulating layer, a connection wire layer and a third insulating layer that are sequentially arranged in a direction perpendicular to the substrate and pointing from the substrate to the anode, and are disposed between the substrate and a film layer where the plurality of anodes are located. The pixel circuit layer includes a plurality of first pixel circuits disposed at the periphery of the light-transmissive area. A plurality of second via holes are provided in the second insulating layer, and a plurality of third via holes are provided in the third insulating layer. The connection wire layer includes a plurality of connection wires, a first end of each connection wire is electrically connected to a respective first pixel circuit through a respective second via hole, and a second end of the connection wire is electrically connected to a second anode portion of a respective anode through a respective third via hole.

In some embodiments, the connection wire layer further includes a plurality of pads, each pad is electrically connected to a second end of a respective connection wire, and each pad is electrically connected to a second anode portion of a respective anode through a respective third via hole.

In another aspect, a method for manufacturing a display panel is provided. The method includes: fabricating a plurality of shielding patterns separated from each other on a substrate; fabricating a plurality of light-emitting layers on a side of the plurality of shielding patterns away from the substrate; fabricating a cathode film on a side of the plurality of light-emitting layers away from the substrate; and irradiating an area of the substrate corresponding to a light-transmissive area of the display panel from a side of the substrate away from the cathode film by using a laser beam to remove portions that are not shielded by the plurality of shielding patterns in a portion of the cathode film located in the area, so as to form a plurality of cathodes separated from each other. Each light-emitting layer and a respective cathode constitutes a portion of a light-emitting device. The light-emitting device has an active light-emitting area, and an orthogonal projection of the active light-emitting area on the substrate is located within an orthogonal projection of the cathode on the substrate.

In some embodiments, fabricating the plurality of shielding patterns separated from each other on the substrate, includes: fabricating a plurality of anodes separated from each other on the substrate. An anode is as a shielding pattern.

In some embodiments, fabricating the plurality of shielding patterns separated from each other on the substrate, includes: fabricating a patterned semiconductor layer, a patterned gate metal layer and a patterned source-drain metal layer on the substrate; forming the plurality of shielding patterns in a process of forming the patterned semiconductor layer or gate metal layer or source-drain metal layer. The source-drain metal layer is farther away from the substrate than the semiconductor layer and the gate metal layer. After fabricating the plurality of shielding patterns separated from each other on the substrate and before fabricating the plurality of light-emitting layers, the method further includes: fabricating a plurality of anodes. Each light-emitting device includes a respective anode.

In yet another aspect, a display apparatus is provided. The display apparatus includes a display panel and a functional device, and the display panel is the display panel in any of the above embodiments. The functional device is disposed on a back side of the display panel and located in the light-transmissive area of the display panel.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
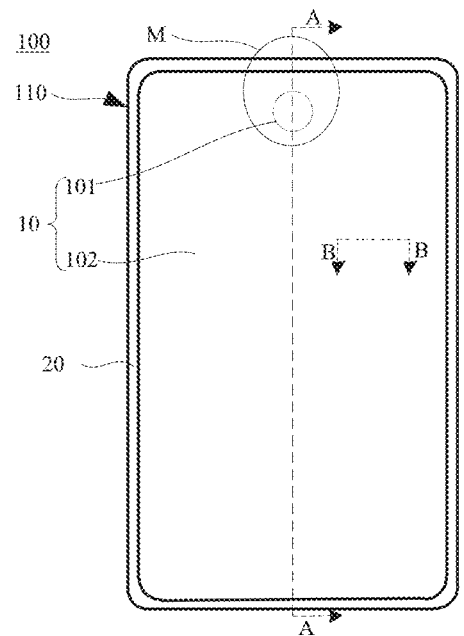
FIG. 1 is a top view of a display panel, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on some embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to", In the description of the specification, the terms such as "some embodiments", "example", "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined by "first" and "second" may explicitly or implicitly include one or more of the features. In the description of the embodiments of the present disclosure, the term "a plurality of/the plurality of/multiple" means two or more unless otherwise specified.

In the description of some embodiments, the terms "connected" and "electrically connected" and their derivatives may be used. For example, the term "connected" may be used in the description of some embodiments to indicate that two or more components are in direct or indirect physical contact with each other. For another example, the term "electrically connected" may be used in the description of some embodiments to indicate that two or more components are in direct or indirect electrical contact.

As used herein, the term such as "about", "substantially" or "approximately" includes a stated value and an average value within an acceptable range of deviation of a particular value. The acceptable range of deviation is determined by a person of ordinary skill in the art in view of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and areas are enlarged for clarity. Therefore, variations in shape with respect to the drawings due to, for example, manufacturing technologies and/or tolerances may be envisaged. Therefore, the exemplary embodiments should not be construed as being limited to the shapes of the areas shown herein, but as including shape deviations due to, for example, manufacturing. For example, an etched area that is shown in a rectangle generally has a curved feature. Therefore, the areas shown in the accompanying drawings are schematic in nature, and their shapes are not intended to show actual shapes of the areas in a device, and are not intended to limit the scope of the exemplary embodiments.

In this text, the expression "an orthogonal projection of A on a substrate covers an orthogonal projection of B on the substrate" is used, which means that a border of the orthogonal projection of A on the substrate coincides with a border of the orthogonal projection of B on the substrate; or the border of the orthogonal projection of A on the substrate does not coincide at least partially with the border of the orthogonal projection of B on the substrate, and the orthogonal projection of B on the substrate is located within the orthogonal projection of A on the substrate.

In this text, the expression "in a same layer" is used, which means that a mask is used to form a film layer with a specific pattern through a single patterning process. Depending on the specific patterns, the single patterning process may include several exposure, development or etching processes, and the specific patterns in the formed layer structure may be continuous or discontinuous, and these specific patterns may also be at different heights or have different thicknesses.

As shown in FIG. 1, some embodiments of the present disclosure provide a display apparatus 100, which may be any product or component having a display function, such as a television, a display, a notebook computer, a tablet computer, a mobile phone or a navigator.

The display apparatus 100 adopts a technology in which functional device(s) are provided on a back side of a screen. The functional device is, for example, a device that can realize a specific function, such as a front camera assembly, an under-screen fingerprint assembly, a 3D face recognition assembly, an iris recognition assembly or a proximity sensor. For example, a front camera assembly is provided on the back side of the screen. That is, the display apparatus 100 adopts an under-screen camera technology.

Referring to FIG. 1, the display apparatus 100 includes a display panel 110. The display panel 110 has a display area 10. The display area 10 includes a light-transmissive area 101 and a main display area 102 located at a periphery of the light-transmissive area 101.

A plurality of sub-pixels are provided in the main display area 102, and mainly function to display images.

A plurality of sub-pixels are also provided in the light-transmissive area 101, so that the light-transmissive area 101 may participate in image display. In addition, the light-transmissive area 101 may transmit light. A position of the light-transmissive area 101 in the display area 10 is not unique. For example, the light-transmissive area 101 may be disposed at an upper middle of the display area 10 (referring to FIG. 1), at an upper left or right of the display area 10, at a lower middle of the display area 10, or the like.

Figure 2:
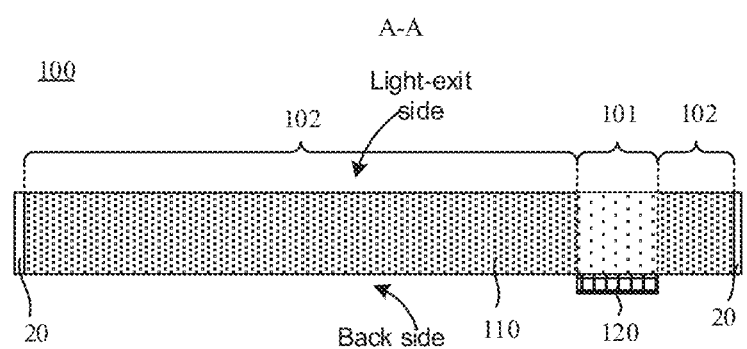
FIG. 2 is a sectional view of the display panel in FIG. 1 taken along the section line A-A.

Referring to FIG. 2, a functional device 120 is provided on a back side of the light-transmissive area 101 of the display panel 110. For example, a front camera assembly is provided on the back side of the light-transmissive area 101. When the display panel 110 displays an image, the light-transmissive area 101 and the main display area 102 may display the image together. When the front camera assembly shoots an image, external light may pass through the light-transmissive area 101 and reach the front camera assembly.

In some embodiments, the display panel 110 may further have a peripheral area 20, and the peripheral area 20 may surround the display area 10 (referring to FIG. 1), or may only be located on one or more sides of the display area 10. Sub-pixels may also be provided in the peripheral area 20, so that the peripheral area also has a display function. As a result, a screen-to-body ratio of the display panel 110 approaches or reaches 100%.

Figure 3:
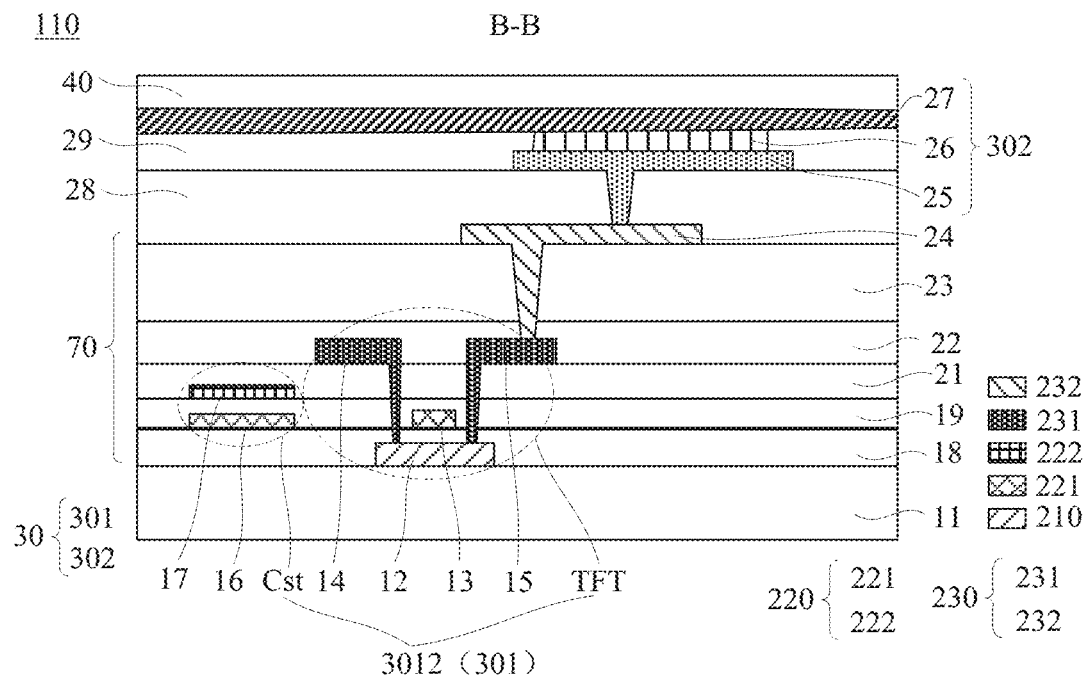
FIG. 3 is a sectional view of the display panel in FIG. 1 taken along the section line B-B.

In some embodiments, the display panel 110 may be an organic light-emitting diode (OLEO) display panel. Referring to FIG. 3, FIG. 3 is a sectional view of a sub-pixel in the main display area 102 in FIG. 1. The display panel 110 includes a substrate 11, sub-pixels 30 disposed on the substrate 11, and an encapsulation layer 40 for encapsulating the sub-pixels 30. Referring to FIG. 3, each sub-pixel 30 of the display panel 110 includes a pixel circuit 301 and a light-emitting device 302 that are disposed on the substrate 11.

In some embodiments, referring to FIG. 3, the pixel circuit 301 includes a plurality of thin film transistors TFT and at least one storage capacitor Cst. The thin film transistor TFT includes an active layer 12, a gate 13, a source 14 and a drain 15 that are disposed on the substrate 11. The storage capacitor Cst includes a first electrode 16 and a second electrode 17 that are arranged opposite to each other.

A film layer in which active layers 12 are located is a semiconductor layer 210. Gates 13 and first electrodes 16 are made of a same material and are disposed in a same layer, and the film layer in which the gates 13 and the first electrodes 16 are located is referred to as a first gate metal layer 221; and a film layer in which second electrodes 17 are located may be referred to as a second gate metal layer 222. That is, the display panel 110 may include two gate metal layers 220. A film layer in which sources 14 and drains 15 are located is referred to as a first source-drain metal layer 231.

A gate insulating layer 18 is provided between the semiconductor layer 210 and the first gate metal layer 221. A first interlayer insulating layer 19 is provided between the first gate metal layer 221 and the second gate metal layer 222, A second interlayer insulating layer 21 is provided between the second gate metal layer 222 and the first source-drain metal layer 231.

In addition, a passivation layer 22 and a planarization layer 23 are provided on a side of the first source-drain metal layer 231 away from the substrate 11.

One of the source 14 and the drain 15 of the thin film transistor TFT is electrically connected to the light-emitting device 302 to transmit a voltage signal to the light-emitting device 302 to drive the light-emitting device 302 to emit light. The source 14 or drain 15 of the thin film transistor TFT may be directly or indirectly electrically connected to the light-emitting device 302. For example, as shown in FIG. 3, the display panel 110 further includes another source-drain metal layer disposed on a side of the planarization layer 23 away from the substrate 11, which may be referred to as a second source-drain metal layer 232. Connection electrodes 24 are provided in the second source-drain metal layer 232. The drain 15 of the thin film transistor TFT is electrically connected to the light-emitting device 302 through a connection electrode 24. In this case, the display panel 110 includes two source-drain metal layers 230.

Referring to FIG. 3, the light-emitting device 302 is located on a side of film layers, in which the pixel circuit 301 is located, away from the substrate 11. The light-emitting device 302 includes an anode 25, a light-emitting layer 26 and a portion of a cathode film 27. In a case where the display panel 110 includes two source-drain metal layers 230, at least one insulating layer 28 is provided between the anode 25 and the second source-drain metal layer 232, and the anode 25 is electrically connected to the connection electrode 24 through a via hole provided in the at least one insulating layer 28.

Referring to FIG. 3, the display panel further includes a pixel defining layer 29 including a plurality of opening areas. One light-emitting device 302 corresponds to one opening area, and a light emitting layer 26 of the light-emitting device 302 is at least partially disposed in the opening area.

In some embodiments, the light-emitting device 302 further includes one or more of an electron transporting layer (ETL), an electron injection layer (EIL), a hole transporting layer (HTL) and a hole injection layer (HIL).

The display panel 110 may be a top-emission display panel. In this case, the anode 25 closer to the substrate 11 is opaque, and the cathode film 27 farther away from the substrate 11 is transparent or semi-transparent. The display panel 110 may also be a bottom-emission display panel. In this case, the anode 25 closer to the substrate 11 is transparent or semi-transparent, and the cathode film 27 farther away from the substrate 11 is opaque. The display panel 110 may also be a double-sided emission display panel. In this case, both the anode 25 closer to the substrate 11 and the cathode film 27 farther away from the substrate 11 are transparent or semi-transparent.

In order to improve the sensitivity of the functional device 120 disposed on the back side of the light-transmissive area 101 of the display panel 110, it is necessary to ensure that the functional device 120 may receive a sufficient amount of light, and therefore it is necessary to increase a light transmittance of the light-transmissive area 101.

In some embodiments, a resolution of the light-transmissive area 101 is reduced, that is, a distribution density of the sub-pixels 30 in the light-transmissive area 101 is reduced, which may increase the light transmittance of the light-transmissive area 101.

In some other embodiments, as for the OLED display panel, the cathode film 27 is generally a whole layer. Although the cathode film 27 can transmit visible light, a transmittance of the cathode film 27 to visible light is relatively low. Thus, a portion of the cathode film 27 located in the light-transmissive area 101 of the display panel 110 may be patterned to increase the light transmittance of the light-transmissive area 101.

The portion of the cathode film in the light-transmissive area is usually patterned by using a mask in conjunction with a vapor deposition process. However, the accuracy of patterning the cathode film is relatively low due to influences of positioning errors, measurement errors and process accuracy.

Figure 6A:
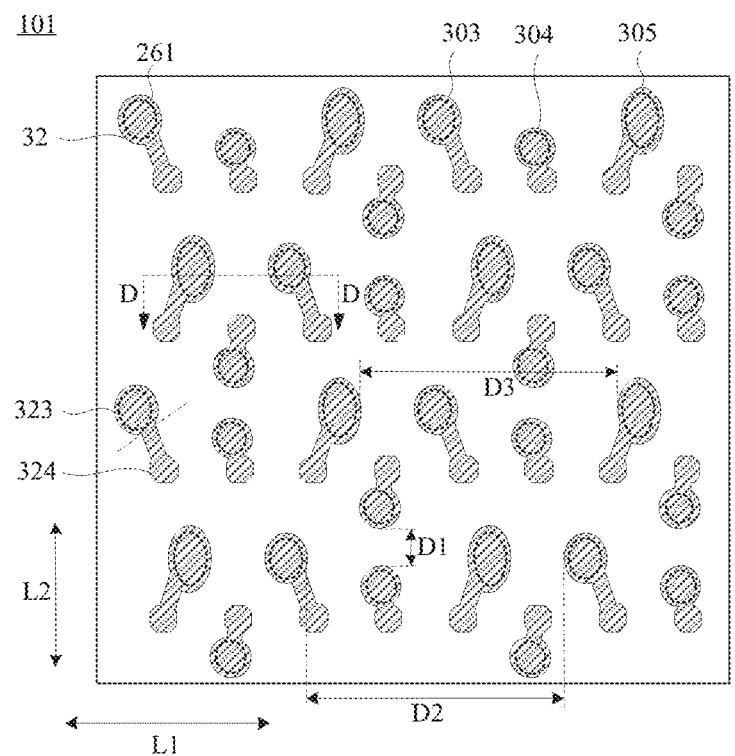
FIG. 6A is a top view of cathodes in a light-transmissive area, in accordance with some embodiments.

In some embodiments of the present disclosure, a display panel 110 is provided. Referring to FIG. 6C, the display panel 110 includes the substrate 11, a plurality of shielding patterns 31 and light-emitting devices 302. The plurality of shielding patterns 31 are disposed on the substrate 11 and located in the light-transmissive area 101.

Figure 6B:
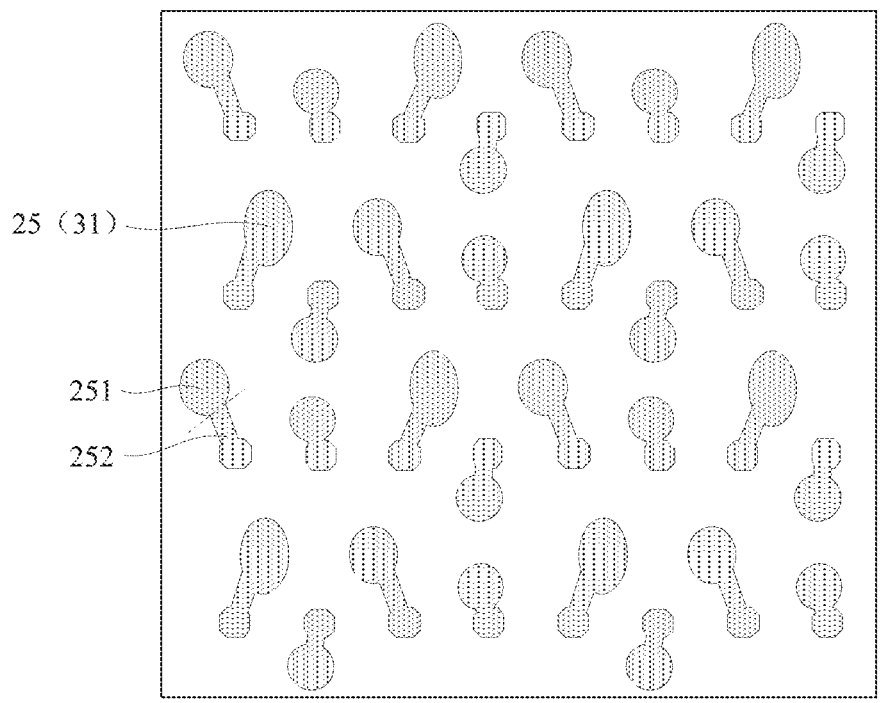
FIG. 6B is a top view of anodes in a light-transmissive area, in accordance with some embodiments.
Figure 6C:
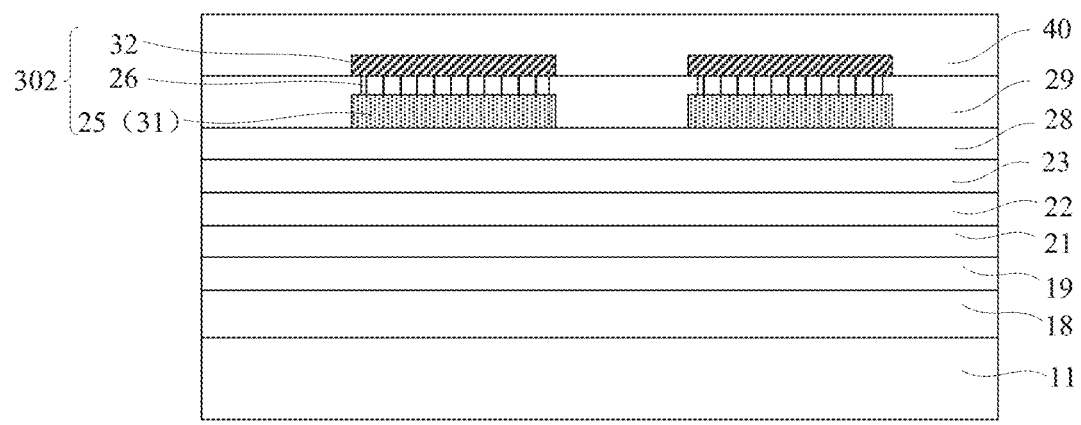
FIG. 6C is a sectional view of the cathodes in the light-transmissive area in FIG. 6A taken along the section line D-D.

Referring to FIG. 6B, orthogonal projections of the plurality of shielding patterns 31 on the substrate 11 are separated from each other.

Referring to FIGS. 6A and 6O, multiple light-emitting devices 302 are provided in the light-transmissive area 101 and on the substrate 11. Each light-emitting device 302 includes a light-emitting layer 26 and a cathode 32 located on a side of the light-emitting layer 26 away from the substrate 11. Each light-emitting device 302 has an active light-emitting area 261, and an orthogonal projection of the active light-emitting area 261 on the substrate 11 is located within an orthogonal projection of a cathode 32 of the light-emitting device 302 on the substrate 11.

Referring to FIG. 6A, orthogonal projections of cathodes 32 of the multiple light-emitting devices 302 on the substrate 11 are separated from each other. Referring to FIG. 6C, the cathodes 32 of the multiple light-emitting devices 302 are located at a side of the plurality of shielding patterns 31 away from the substrate 11. A cathode 32 corresponds to a shielding pattern 31. An orthogonal projection of each shielding pattern 31 on the substrate 11 covers an orthogonal projection of a respective cathode 32 on the substrate 11.

Referring to FIGS. 6A to 6C and 19, in a process of manufacturing the display panel 110, the shielding patterns 31 separated from each other are first fabricated on the substrate 11; then the light-emitting layers 26 and the cathode film 27 are fabricated on a side of the shielding patterns 31 away from the substrate 11: and finally an area of the substrate 11 corresponding to the light-transmissive area 101 of the display panel 110 is irradiated from a side of the substrate 11 away from the cathode film 27 by using a laser beam to remove a portion that is not shielded by the shielding patterns 31 in a portion of the cathode film 27 located in the light-transmissive area 101, so as to form cathodes 32 separated from each other.

Compared with patterning the cathode film by means of the mask in conjunction with vapor deposition, in the display panel 110 of the embodiments of the present disclosure, the laser beam irradiates the substrate 11 from the side of the substrate 11 away from the cathode film 27, and in this process, part of the laser beam is shielded by the shielding patterns 31; and another part of the laser beam not shielded by the shielding patterns 31 reaches the cathode film 27 to remove a portion of the cathode film 27 irradiated by the laser beam and retain portions of the cathode film 27 not irradiated by the laser beam, so as to form independent cathodes 32. Based on a principle of light propagation along a straight line, a shape of the orthogonal projection of the cathode 32 on the substrate 11 is substantially the same as a shape of the orthogonal projection of the shielding pattern 31 on the substrate 11, and the orthogonal projection of the shielding pattern 31 on the substrate 11 covers the orthogonal projection of the cathode 32 on the substrate 11.

The shielding patterns 31 may be formed through a patterning process such as vapor deposition and etching, and a fabricating accuracy of its patterning is relatively high. Patterns of the cathodes 32 may be controlled by controlling positions, shapes and sizes of the shielding patterns 31, so that the accuracy of patterning the cathode film 27 may be improved, and unnecessary cathode materials may be removed as much as possible to improve an aperture ratio of the cathode film 27, thereby improving a transmittance of a film layer in which the cathodes 32 are located to visible light.

In some embodiments, a transmittance of the cathode 32 to visible light is greater than a transmittance of the cathode 32 to infrared light. The cathode 32 is located on the side of the light-emitting layer 26 away from the substrate 11, and light emitted by the light-emitting layer 26 needs to pass through the cathode 32 to exit therefrom. A laser beam in an infrared wavelength range may be used to irradiate the area of the substrate 11 corresponding to the light-transmissive area 101 of the display panel 110, so as to improve the efficiency of patterning the cathode film 27. The transmittance of the cathode 32 to visible light is greater than the transmittance of the cathode 32 to infrared light, and thus the cathode 32 may transmit at least part of the visible light for displaying an image, and may absorb at least part of the infrared light, so that a portion of the cathode film 27 irradiated by the laser beam in the infrared wavelength range may be removed.

In some embodiments, the transmittance of the shielding pattern 31 to infrared light is less than or equal to 2%, such as 2%, 1.5%, 1%, 0.5% or 0%. In this way, when the laser beam in the infrared wavelength range is used to irradiate the area of the substrate 11 corresponding to the light-transmissive area 101 of the display panel 110, the shielding pattern 31 may absorb most or all of the infrared light, thereby reducing a laser beam in the infrared wavelength range passing through the shielding pattern 31, and preventing the infrared light from directly reaching portions of the cathode film 27 shielded by the shielding patterns 31.

In some embodiments, a material of the cathode film 27 includes a magnesium-silver alloy. First of all, the magnesium-silver alloy may transmit visible light, and when the display panel displays an image, the light may be emitted from the cathodes 32; moreover, the magnesium-silver alloy may absorb infrared light, and when the infrared light is irradiated onto the cathode film 27 made of the magnesium-silver alloy, the portion that is not shielded by the shielding patterns 31 may be removed.

Figure 12:
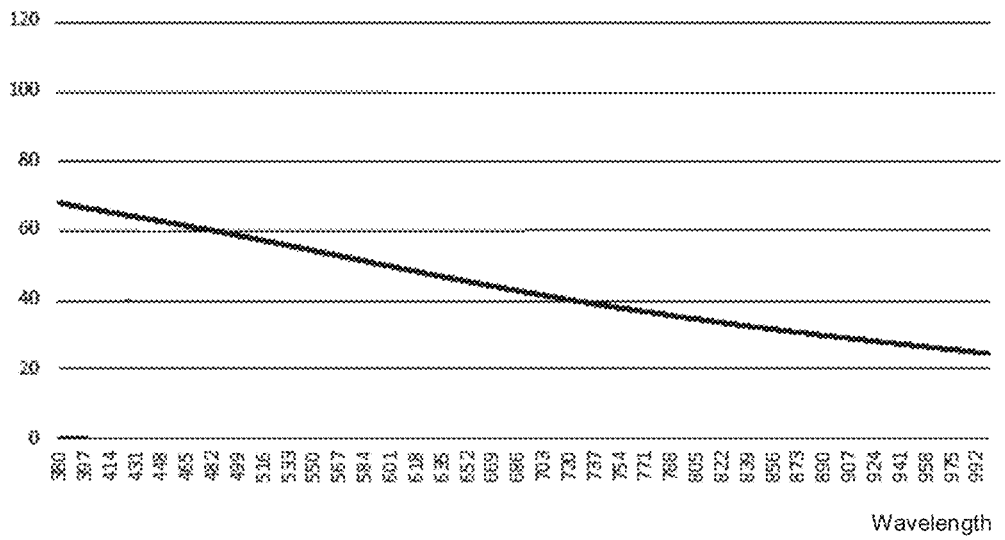
FIG. 12 is a graph showing transmittances of a cathode film to light with different wavelengths, in accordance with some embodiments.

Referring to FIG. 12, FIG. 12 shows a transmittance curve of the cathode film 27 to light with different wavelengths in a case where a thickness of the cathode film 27 is 13 nm. In some examples, infrared light with a wavelength of 900 nm may be used, and in this case, the transmittance of the cathode film 27 is approximately 29%. Infrared light with a wavelength of 940 nm may also be used, and in this case, the transmittance of the cathode film 27 is approximately 27.2%. Infrared light with a wavelength of 960 nm may also be used, and in this case, the transmittance of the cathode film 27 is approximately 26.1%. It will be understood that infrared light with other wavelengths may also be used, which will not be listed one by one herein.

In some embodiments, referring to FIG. 6C, each light-emitting device 302 further includes an anode 25, which is located on a side of the light-emitting layer 26 proximate to the substrate 11. An anode 25 forms a shielding pattern 31. In a case where the anode 25 is made of an opaque metal, the anode 25 may absorb infrared light. The anode 25 may be set as the shielding pattern 31. In this way, a film structure of the display panel 110 is simple, no new film layer needs to be added, and the manufacturing cost is low.

In a case where an anode 25 forms a shielding pattern 31, for example, if a thickness of the anode 25 is 100 nm, a material of the anode 25 is opaque. Alternatively, in the case where the thickness of the anode 25 is 100 nm, a transmittance of the material of the anode 25 to infrared light is less than or equal to 2%.

For example, referring to FIGS. 6A and 6B, based on the principle of light propagation along the straight line, the orthogonal projection of the cathode 32 on the substrate 11 and an orthogonal projection of a respective anode 25 on the substrate 11 are substantially the same in shape and size, and the orthogonal projection of the anode 25 on the substrate 11 covers the orthogonal projection of the respective cathode 32 on the substrate 11.

Figure 14:
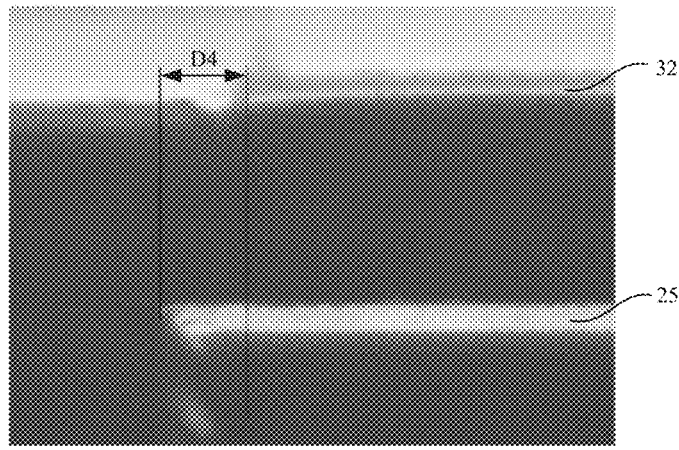
FIG. 14 is an electron micrograph of borders of an anode and a cathode, in accordance with some embodiments.

Referring to FIG. 6C, as an illustration, an orthogonal projection of a border of the cathode 32 on the substrate 11 coincides with an orthogonal projection of a border of the anode 25 on the substrate 11. However, in some embodiments, a diffraction phenomenon may be generated for the laser beam during irradiation of the laser beam to the anode 25. Based on this, referring to FIG. 14, FIG. 14 is a microscopic electron micrograph of borders of the anode 25 and the cathode 32 in a case where the anode 25 is used as the shielding pattern 31. A border of the orthogonal projection of the anode 25 on the substrate 11 is beyond a border of the orthogonal projection of the cathode 32 on the substrate 11 by a certain distance D4. That is, the border of the orthogonal projection of the cathode 32 on the substrate 11 is located inside the border of the orthogonal projection of the anode 25 on the substrate 11. That is, an area of the orthogonal projection of the anode 25 on the substrate 11 is larger than an area of the orthogonal projection of the respective cathode 32 on the substrate 11.

Figure 8A:
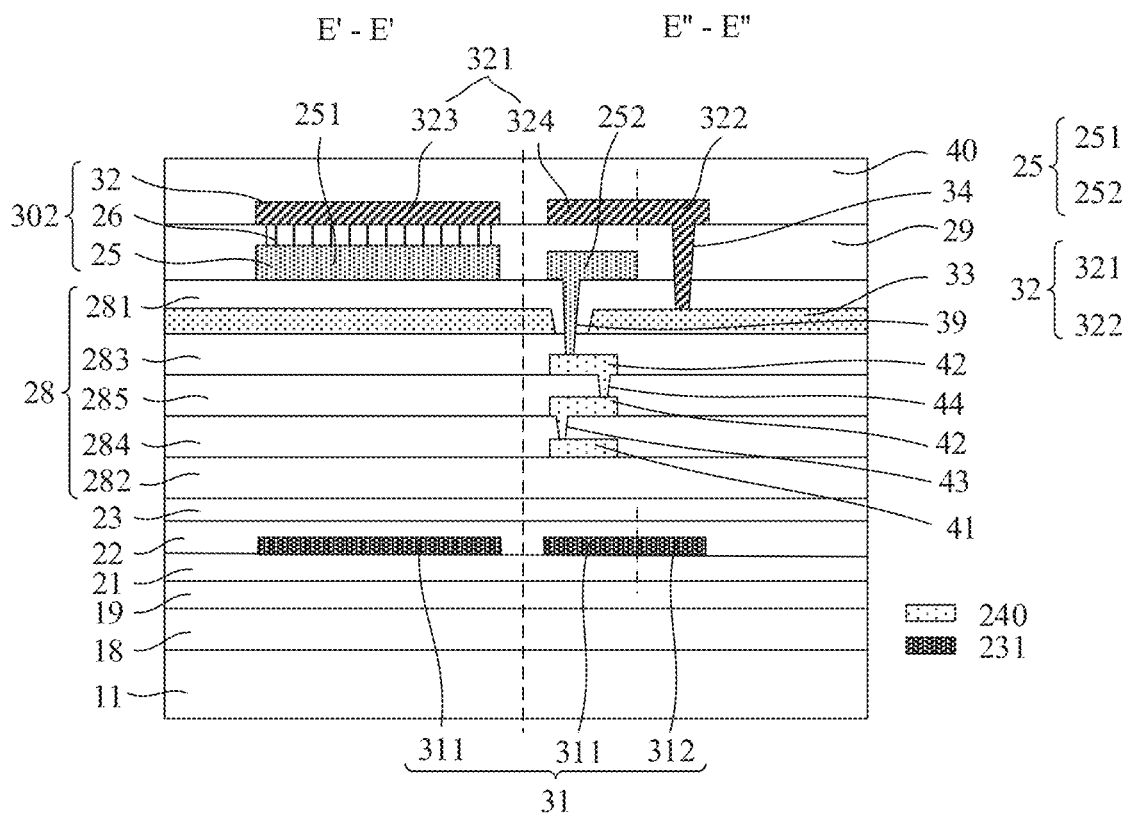
FIG. 8A is a sectional view of the cathodes in the light-transmissive area in FIG. 7A taken along section lines E'-E' and E"-E"

In some embodiments, referring to FIG. 8A, each light-emitting device 302 includes an anode 25, and the anode 25 is located on the side of the light-emitting layer 26 proximate to the substrate 11. The shielding patterns 31 are located at a side of anodes 25 of the multiple light-emitting devices 302 proximate to the substrate 11. A shielding pattern 31 corresponds to an anode 25, and the orthogonal projection of the shielding pattern 31 on the substrate 11 is at least partially overlapped with an orthogonal projection of the anode 25 on the substrate 11.

For example, the orthogonal projection of the shielding pattern 31 on the substrate 11 is partially overlapped with the orthogonal projection of the respective anode 25 on the substrate 11. That is, the orthogonal projection of the shielding pattern 31 on the substrate 11 covers a portion of the orthogonal projection of the anode 25 on the substrate 11. In this case, a shape of the cathode 32 is determined by the shielding pattern 31 and the anode 25 together, and the shielding pattern 31 may function to partially protect the anode 25.

For another example, the orthogonal projection of the shielding pattern 31 on the substrate 11 is completely overlapped with the orthogonal projection of the respective anode 25 on the substrate 11. That is, the orthogonal projection of the shielding pattern 31 on the substrate 11 completely covers the orthogonal projection of the anode 25 on the substrate 11. In this case, the shape of the cathode 32 is determined by the shielding pattern 31, and the shielding pattern 31 may completely protect the anode 25.

In a case where the anode 25 is made of a transparent material or a semi-transparent material, and the material of the anode 25 can transmit infrared light, or in a case where there is a risk of damage to the anode 25 by the laser beam in the infrared wavelength range, if the shielding patterns 31 are disposed on a side of the anodes 25 proximate to the substrate 11, and a shielding pattern 31 corresponds to an anode 25, the shielding patterns 31 may protect the anodes 25.

Infrared light has light energy, and after a film layer absorbs infrared light, a temperature of the film layer will increase. The anode 25 is a portion of the light-emitting device 302, and an increase in temperature of the anode 25 may cause damage to the anode 25. The shielding pattern 31 can reduce the risk of damage to the anode 25 due to the increase in temperature of the anode 25, thereby improving the safety of a manufacturing process of the display panel 110 and yield of the display panel 110.

In some embodiments, referring to FIG. 3, the display panel 110 further includes the semiconductor layer 210, the gate metal layer 220 and the source-drain metal layer 230. The semiconductor layer 210 is located between the substrate 11 and the plurality of anodes 25. The gate metal layer 220 is located between the substrate 11 and the plurality of anodes 25. The source-drain metal layer 230 is farther away from the substrate 11 than the semiconductor layer 210 and the gate metal layer 220, and is located on the side of the plurality of anodes 25 proximate to the substrate 11. The shielding patterns 31 are located in the semiconductor layer 210 or the gate metal layer 220 or the source-drain metal layer 230.

It will be noted that the gate metal layer 220 may be located on a side of the semiconductor layer 210 away from or proximate to the substrate 11. In a case where the gate metal layer 220 is located on the side of the semiconductor layer 210 away from the substrate 11, the gate 13 of the thin film transistor of the pixel circuit is located on a side of the active layer 12 away from the substrate 11. In this case, the thin film transistor has a top-gate structure. In a case where the gate metal layer 220 is located on the side of the semiconductor layer 210 proximate to the substrate 11, the gate 13 of the thin film transistor of the pixel circuit is located on a side of the active layer 12 proximate to the substrate 11. In this case, the thin film transistor has a bottom-gate structure.

In the above embodiments, by providing the shielding patterns 31 in the semiconductor layer 210 or the gate metal layer 220 or the source-drain metal layer 230, it is possible to eliminate the need to add an additional layer to the display panel 110, thereby not affecting a thickness of the display panel 110 and eliminating the need to add an additional process step.

In a case where the display panel 110 includes two gate metal layers 220, the shielding patterns 31 may be disposed in either of the two gate metal layers 220. In a case where the display panel 110 includes two source-drain metal layers 230, the shielding patterns 31 may be disposed in either of the two source-drain metal layers 230.

Figure 8B:
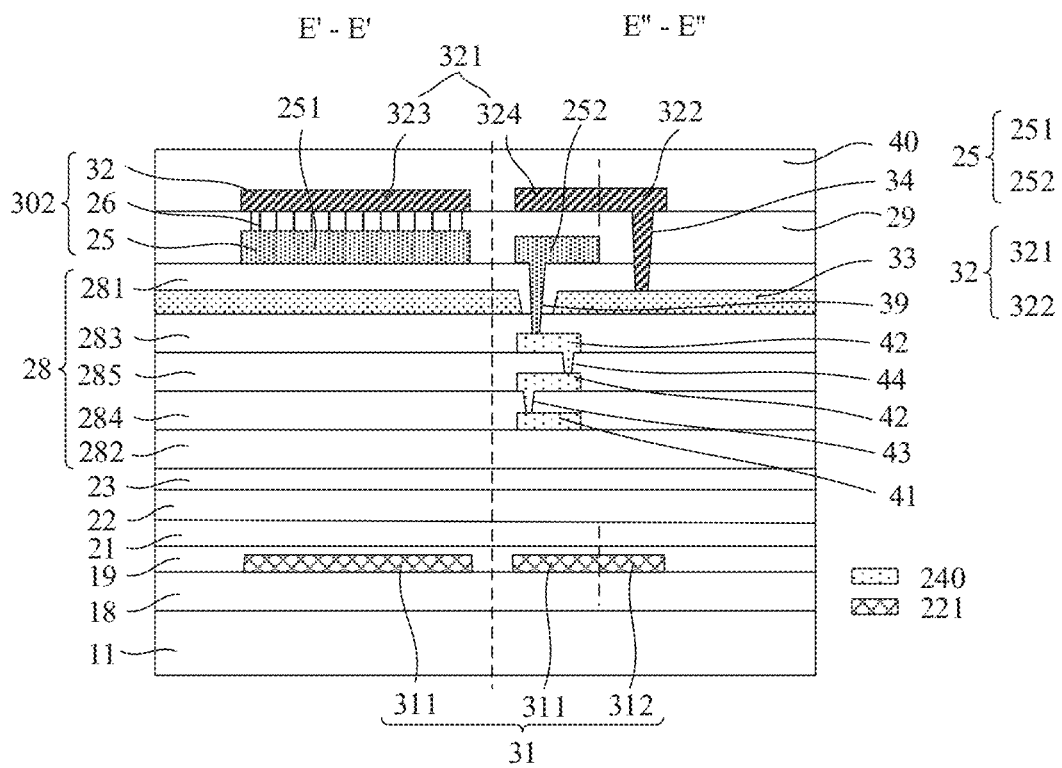
FIG. 8B is another sectional view of the cathodes in the light-transmissive area in FIG. 7A taken along section lines E'-E' and E"-E"
Figure 8C:
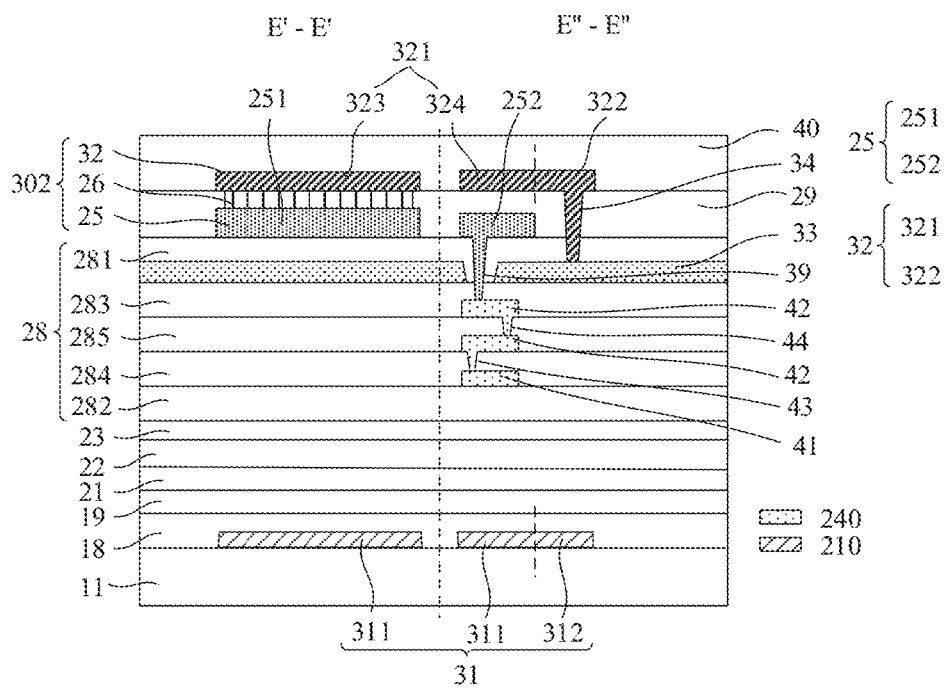
FIG. 8C is yet another sectional view of the cathodes in the light-transmissive area in FIG. 7A taken along section lines E'-E' and E"-E"

For example, referring to FIG. 8A, the shielding patterns 31 are located in the first source-drain metal layer 231 in which the source 14 and the drain 15 of the thin film transistor are located. For example, referring to FIG. 8B, the shielding patterns 31 are located in the first gate metal layer 221 in which the gate 13 of the thin film transistor is located. For example, referring to FIG. 8C, the shielding patterns 31 are located in the semiconductor layer 210.

Figure 8D:
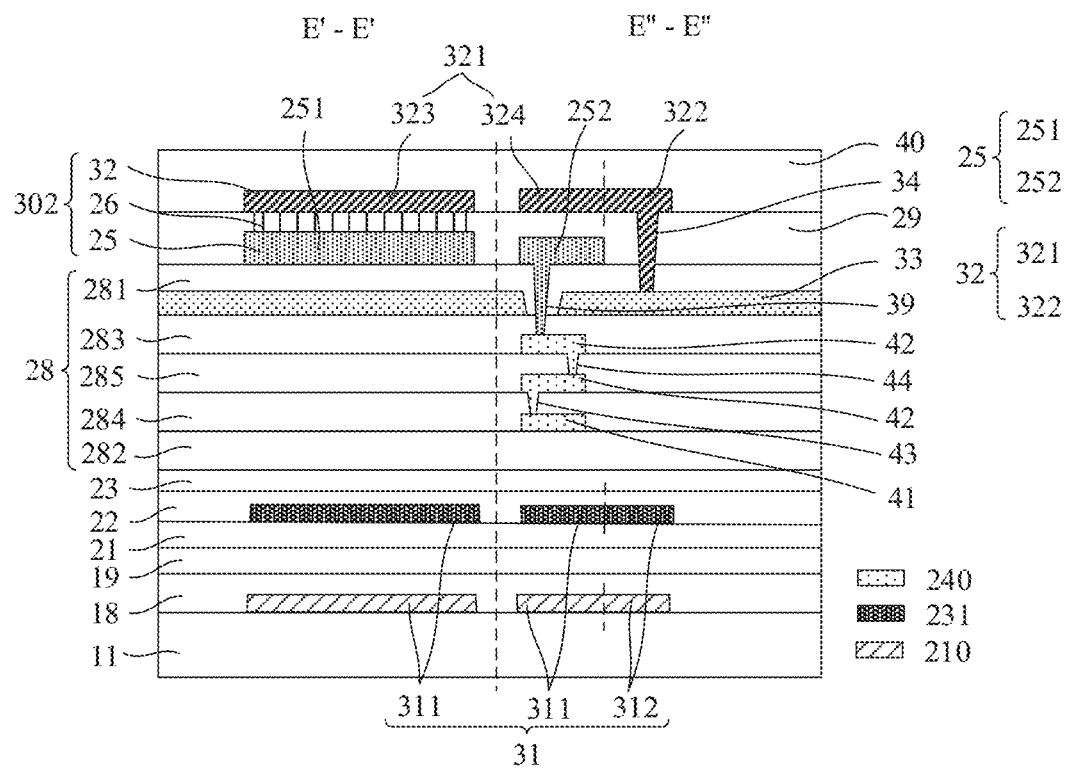
FIG. 8D is yet another sectional view of the cathodes in the light-transmissive area in FIG. 7A taken along section lines E'-E' and E"-E"

In addition, as shown in FIGS. 8A to 8O, all shielding patterns 31 in the plurality of shielding patterns 31 may be disposed in a same film layer in the semiconductor layer 210, the gate metal layers 220 and the source-drain metal layers 230. The plurality of shielding patterns 31 may also be disposed in at least two film layers of the semiconductor layer 210, the gate metal layers 220 and the source-drain metal layers 230. Two or more layers of shielding patterns 31 may also be provided below a same light-emitting device 302, so as to achieve a better protection effect on the anode 25 of the light-emitting device 302 by using the plurality of layers of shielding patterns 31, For example, referring to FIG. 8D, two layers of shielding patterns 31 are provided at a side of each anode 25 proximate to the substrate 11. One of the two layers of shielding patterns 31 is located in the semiconductor layer 210, and the other layer is located in the first gate metal layer 221.

In a case where the shielding patterns 31 are located in the semiconductor layer 210 or the gate metal layer 220 or the source-drain metal layer 230, a material of the shielding patterns 31 may be the same as a metal material of a film layer in which the shielding patterns 31 are located. For example, in the case where the shielding patterns 31 are located in the source-drain metal layer 230, the material of the shielding patterns 31 may be the same as a material of the source-drain metal layer 230. In this case, it is possible to form the plurality of shielding patterns 31 in a process of manufacturing the patterned source-drain metal layer 230, which eliminates the need to add an additional process, simplifies the manufacturing process of the display panel and reduces the production cost of the display panel.

In some embodiments, a transmittance of the shielding pattern 31 to visible light is greater than a transmittance of the shielding pattern 31 to infrared light, and thus the shielding pattern 31 may be used to shield infrared laser beam to prevent the anode 25 from being damaged due to irradiation of the infrared laser beam. For example, the transmittance of the shielding pattern 31 to infrared light is less than or equal to 2%, such as 2%, 1.5%, 1%, 0.5% or 0%, so as to shield most or all of the infrared laser beam.

In some embodiments, a thickness of the shielding pattern 31 is greater than a thickness of the cathode 32. Both the shielding pattern 31 and the cathode 32 have a higher transmittance to visible light than to infrared light. Therefore, if the shielding pattern 31 and the cathode 32 are made of same or similar materials and the thickness of the shielding pattern 31 is greater than the thickness of the cathode 32, it is possible to ensure that, when the laser beam in the infrared wavelength range is used to irradiate the area of the substrate 11 corresponding to the light-transmissive area 101 of the display panel 110, the shielding pattern 31 will not melt into a liquid state or evaporate into a gas state under irradiation of infrared light on a premise of ensuring that a portion of the cathode film 27 irradiated by the infrared light may be removed.

As mentioned in the foregoing, during a process in which laser beam is irradiated to the shielding pattern 31, the laser beam is diffracted, which will cause that a border of the orthographic projection of the shielding pattern 31 on the substrate 11 is beyond the border of the orthographic projection of the cathode 32 on the substrate 11.

Based on this, in some embodiments, the material of the shielding pattern 31 includes silver, which is capable of absorbing infrared light and transmitting visible light. In a process of patterning the portion of the cathode film in the light-transmissive area by using the laser beam in the infrared wavelength range, the shielding pattern 31 may absorb infrared light, so as to shield the infrared light irradiated to the anode 25. During the use of the display panel 110, visible light enters the light-transmissive area 101 from the light-exit side of the display panel 110, and the visible light irradiated to the portion of the shielding pattern 31 beyond the border of the cathode 32 may pass through the shielding pattern 31, thereby reducing the influence of the portion of the shielding pattern 31 beyond the border of the cathode 32 on the shielding of the visible light. It will be noted that the material of the shielding pattern 31 is not limited to silver, and the material of the shielding pattern 31 may also be another material, a transmittance of which to visible light is greater than a transmittance thereof to infrared light. In addition, in a case where the material of the shielding pattern 31 includes silver, a material of the cathode 32 may include a magnesium-silver alloy.

Figure 13:
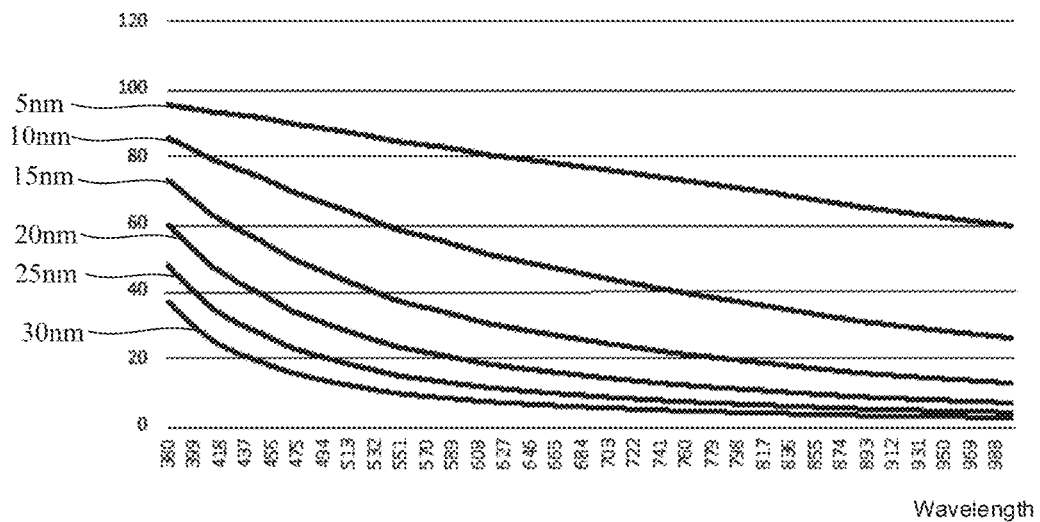
FIG. 13 is a graph showing transmittances of silver layers with different thicknesses to light with different wavelengths, in accordance with some embodiments.

In the case where the material of the shielding pattern 31 includes silver, the transmittance of the shielding pattern 31 to infrared light may be controlled by controlling the thickness of the shielding pattern 31. Referring to FIG. 13, FIG. 13 is a schematic diagram showing transmittances of silver layers with different thicknesses to light with different wavelengths. For example, if infrared light with a wavelength of 920 nm is used, a transmittance of a silver layer with a thickness of 20 nm is approximately 7.992%; a transmittance of a silver layer with a thickness of 25 nm is approximately 4.169%; and a transmittance of a silver layer with a thickness of 30 nm is approximately 2.773%. Therefore, in a case where infrared light with the wavelength of 920 nm is used as a laser source, silver with a thickness of 30 nm or greater than 30 nm, such as 35 nm, 38 nm or 45 nm, may be used as the shielding pattern 31.

Since voltages required by the cathodes 32 of the light-emitting devices 302 of the sub-pixels 30 are the same, the cathodes 32 separated from each other in the light-transmissive area 101 need to be connected to each other. There are many manners to connect the cathodes 32 separated from each other. For example, a transparent conductive layer may be provided, and the cathodes 32 separated from each other are electrically connected to the transparent conductive layer. For another example, a cathode connection structure may be provided among the cathodes 32 separated from each other to electrically connect the cathodes 32 separated from each other.

Figure 7A:
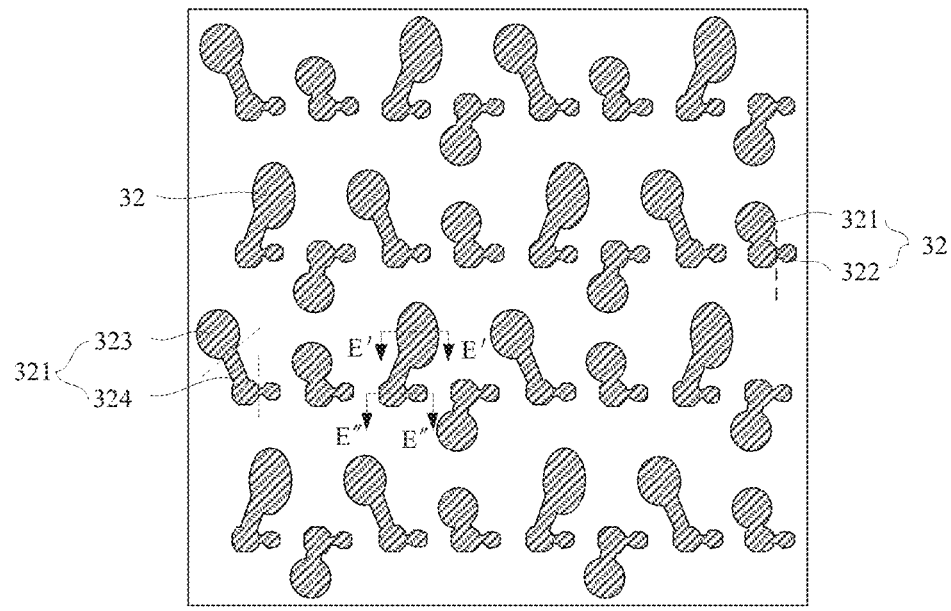
FIG. 7A is another top view of cathodes in a light-transmissive area, in accordance with some embodiments.

As for the manner in which the cathodes 32 separated from each other are connected by providing the transparent conductive layer, in some embodiments, referring to FIG. 7A, the cathode 32 includes a cathode body portion 321 and a cathode connection portion 322. Referring to FIG. 8A, the orthogonal projection of the anode 25 on the substrate 11 covers an orthogonal projection of the cathode body portion 321 on the substrate 11. The cathode connection portion 322 is electrically connected to the cathode body portion 321 (referring to FIG. 7A), and an orthogonal projection of the cathode connection portion 322 on the substrate 11 is not overlapped with the orthogonal projection of the anode 25 on the substrate 11 (referring to FIG. 8A).

Referring to FIG. 8A, the display panel 110 further includes a transparent conductive layer 33 and a first insulating layer 281. The transparent conductive layer 33 is located between a film layer where the shielding patterns 31 are located and the plurality of anodes 25, and the first insulating layer 281 is located between the transparent conductive layer 33 and the plurality of cathodes 32. A plurality of first via holes 34 are provided in the first insulating layer 281. A gap exists between an orthogonal projection of each first via hole 34 on the substrate 11 and an orthogonal projection of an adjacent anode 25 on the substrate 11, The orthogonal projection of the first via hole 34 on the substrate 11 is located within the orthogonal projection of the cathode connection portion 322 on the substrate 11, and each cathode 32 is electrically connected to the transparent conductive layer 33 through at least one first via hole 34. For example, referring to FIG. 8A, each cathode 32 may be electrically connected to the transparent conductive layer 33 through a first via hole 34, For example, the transparent conductive layer 33 may be made of indium tin oxide (ITO).

In this way, by providing the cathode connection portion 322 protruding relative to the border of the anode 25 in the cathode 32, and providing the first via holes 34 in the first insulating layer 281 between the cathode 32 and the transparent conductive layer 33, the cathode connection portion 322 is electrically connected to the transparent conductive layer 33 through the first via hole 34. In addition, since a gap exists between the orthogonal projection of the first via hole 34 on the substrate 11 and the orthogonal projection of the anode 25 on the substrate 11, an avoidance interval exists between the first via hole 34 and the anode 25, and the cathode 32 can thus be electrically insulated from the anode 25 to prevent a short circuit between the cathode 32 and the anode 25.

Figure 7B:
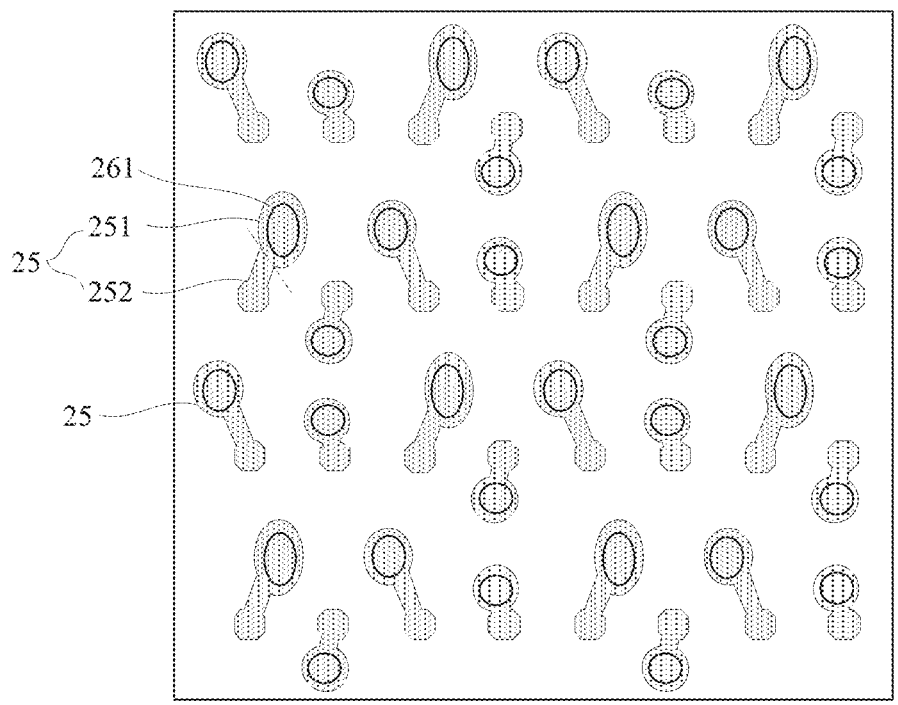
FIG. 7B is another top view of anodes in a light-transmissive area, in accordance with some embodiments.
Figure 7C:
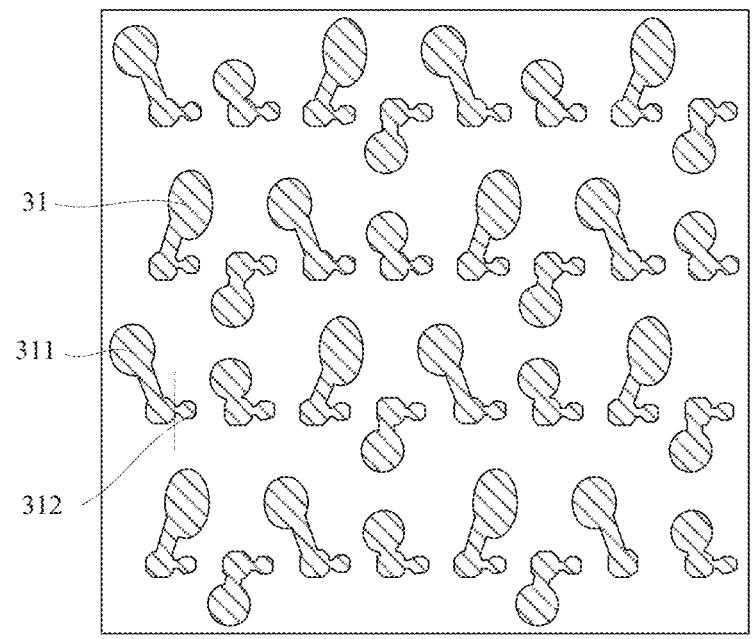
FIG. 7C is a top view of shielding patterns, in accordance with some embodiments.

Referring to FIG. 7C, in order to form the cathode 32 including the cathode body portion 321 and the cathode connection portion 322, the shielding pattern 31 includes a shielding pattern body portion 311 and a shielding pattern connection portion 312 corresponding to the cathode 32. Referring to FIG. 8A, an orthogonal projection of the shielding pattern body portion 311 on the substrate 11 covers the orthogonal projection of the cathode body portion 231 on the substrate 11. The shielding pattern connection portion 312 is connected to the shielding pattern body portion 311 (referring to FIG. 7C), and an orthogonal projection of the shielding pattern connection portion 312 on the substrate 11 covers the orthogonal projection of the cathode connection portion 321 on the substrate 11 (referring to FIG. 8A), so as to form the cathode 32 having the above structure. Based on the principle of light propagation along the straight line, the orthogonal projection of the cathode 32 on the substrate 11 and the orthogonal projection of the respective shielding pattern 31 on the substrate 11 are substantially the same in shape and size.

In the above embodiments, the plurality of cathodes 32 separated from each other in the light-transmissive area 101 are electrically connected through the transparent conductive layer 33. The transparent conductive layer 33 may be directly electrically connected to a signal line for transmitting a voltage signal of cathode, which is disposed around the display area 10. The transparent conductive layer 33 may also be electrically connected to a portion of the cathode film 27 in the main display area 102. In this way, the transparent conductive layer 33 obtains the voltage signal of cathode and transmits the voltage signal of cathode to each cathode 32.

It will be noted that, as shown in FIG. 8A, in addition to the first insulating layer 281, the pixel defining layer 29 is also provided between the transparent conductive layer 33 and the plurality of cathodes 32. Therefore, the first via hole 34 not only needs to extend through the first insulating layer 281, but also needs to extend through the pixel defining layer 29, so that the cathode 32 may be electrically connected to the transparent conductive layer 33 through the first via hole 34.

Figure 9:
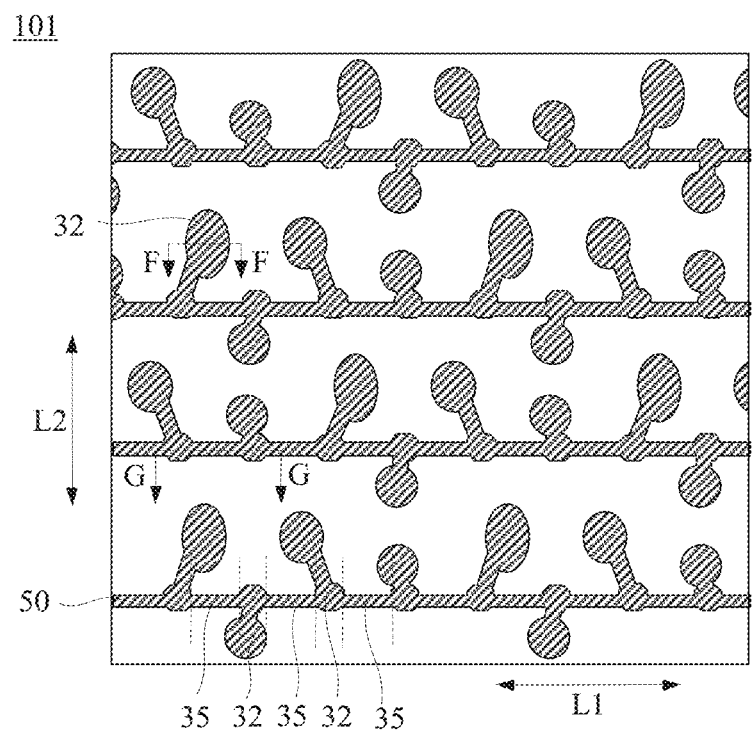
FIG. 9 is yet another top view of cathodes in a light-transmissive area, in accordance with some embodiments.

As for the manner in which the plurality of cathodes separated from each other are connected by providing the cathode connection structure, in some embodiments, referring to FIG. 9, the display panel 110 further includes at least one cathode connection structure 35, and the at least one cathode connection structure 35 and the cathodes 32 are made of a same material and disposed in a same layer. A dimension of the cathode connection structure 35 in a first direction L1 is greater than a dimension thereof in a second direction L2. Each cathode connection structure 35 is electrically connected to two cathodes 32 adjacent thereto. The first direction is a row direction in which a plurality of sub-pixels 30 of the display panel 110 are arranged, i.e., the direction shown by line L1 in FIG. 9. The second direction is a column direction in which the plurality of sub-pixels 30 of the display panel 110 are arranged, i.e., the direction shown by line L2 in FIG. 9.

In the above embodiments, the plurality of cathodes 32 separated from each other are electrically connected by the cathode connection structure(s) 35. The dimension of the cathode connection structure 35 in the first direction L1 is greater than the dimension thereof in the second direction L2, and the cathode connection structure 35 is connected to two cathodes 32 adjacent thereto in the first direction L1. For example, the cathode connection structure 35 may be directly electrically connected to the signal line for transmitting the voltage signal of cathode, which is disposed around the display area 10. The cathode connection structure 35 may also be electrically connected to the portion of the cathode film 27 in the main display area 102. In this way, the cathode connection structure 35 obtains the voltage signal of cathode and transmits the voltage signal of cathode to each cathode 32.

The cathode connection structure 35 and the cathode 32 are made of a same material and disposed in a same layer, so that the cathode connection structure 35 may be manufactured together with the cathode 32. For example, when the cathode film 27 is irradiated by infrared light to perform a pattern processing on an area of the cathode film 27 corresponding to the light-transmissive area 101 of the display panel 100, the cathode 32 and the cathode connection structure 35 are formed simultaneously.

For example, referring to FIG. 9, the display panel 110 includes a plurality of cathode connection structures 35 arranged in a plurality of rows. Each row includes multiple cathode connection structures 35 arranged in the first direction L1. Each row of cathode connection structures 35 and portions of cathodes 32 connected to the cathode connection structures 35 in the row constitute a cathode connection strip 50. In the second direction, the cathode connection strip 50 has substantially a same dimension as the cathode connection structure 35.

For example, the multiple cathode connection structures 35 in each row are substantially located in a straight line.

For another example, multiple cathodes 32 are provided on at least one of opposite sides of the cathode connection strip 50 in the second direction L2, and the multiple cathodes 32 are each connected to the cathode connection strip 50.

For another example, in multiple cathodes 32 in a same row, any two adjacent cathodes 32 are electrically connected to each other by one cathode connection structure 35; and at least part of the multiple cathodes 32 in the same row are located in a same straight line, and the multiple cathode connection structures 35 in the same row are located in the same straight line.

By adopting the above arrangement, it is advantageous to reduce a total length of the plurality of cathode connection structures 35, thereby reducing an area of the projection of the plurality of cathode connection structures 35 on the substrate 11, and reducing the impact of the cathode connection structures 35 on the light transmittance of the film layer in which the plurality of cathodes 32 are located.

There are many manners to form the cathode connection structure(s) 35. For example, the cathode connection structure(s) may be formed by providing shielding connection structure(s) 36 each having a same shape as a respective cathode connection structure 35 in the display panel 110. For another example, the cathode connection structure(s) 35 may be formed by using a mask 200 which is provided on a side of the substrate 11 away from the cathode film 27.

Figure 11A:
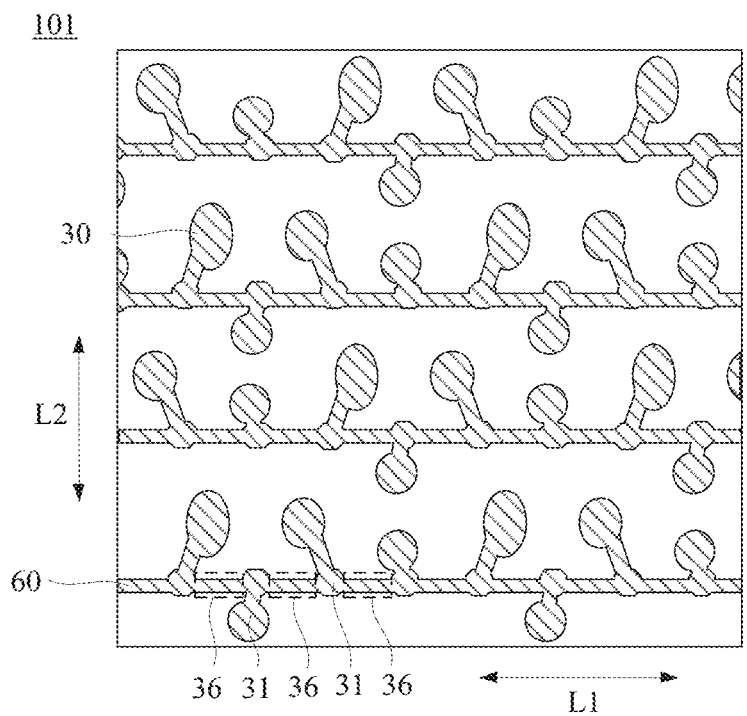
FIG. 11A is yet another top view of shielding patterns, in accordance with some embodiments.
Figure 11B:
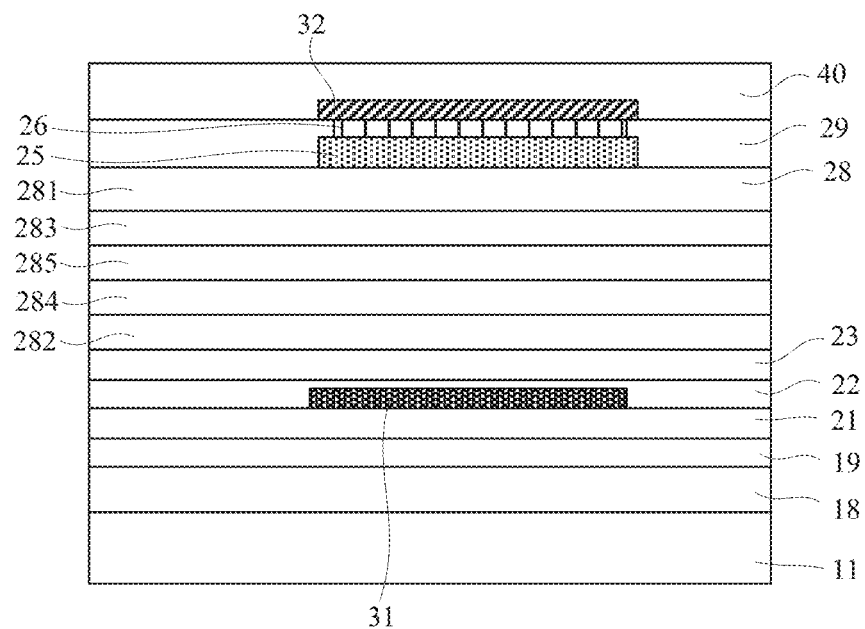
FIG. 11B is a sectional view of the cathodes in the light-transmissive area in FIG. 9 taken along the section line F-F.
Figure 11C:
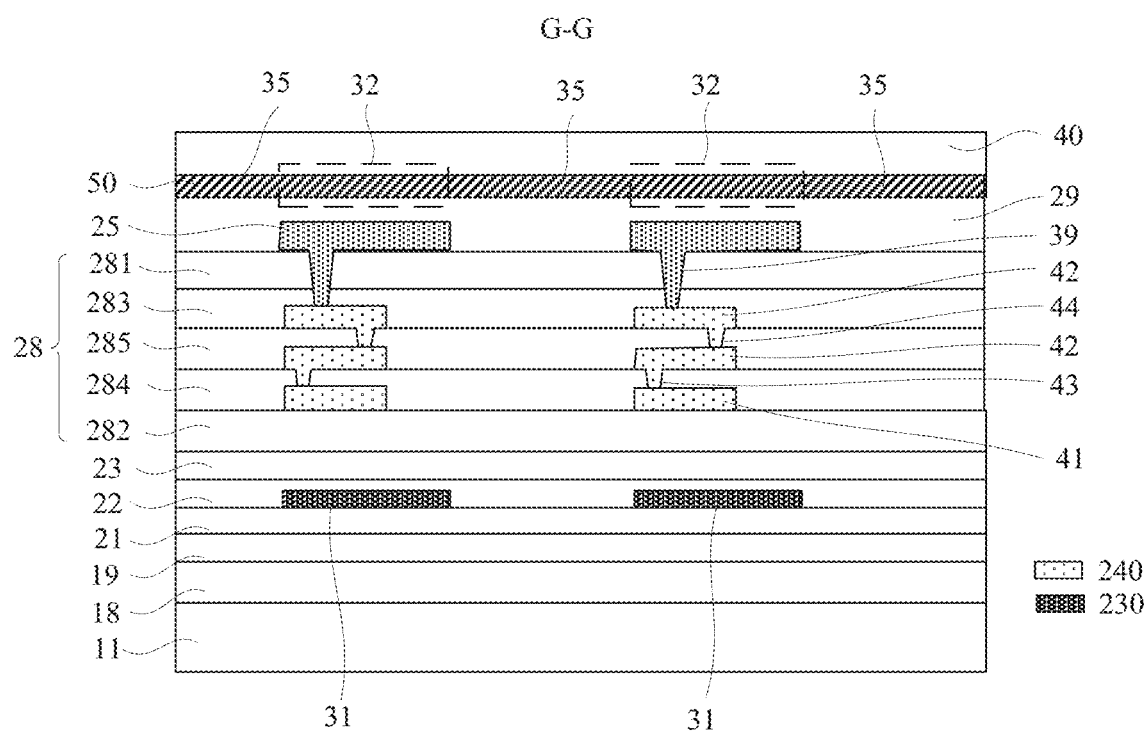
FIG. 11C is a sectional view of the cathodes in the light-transmissive area in FIG. 9 taken along the section line G-G.
Figure 11D:
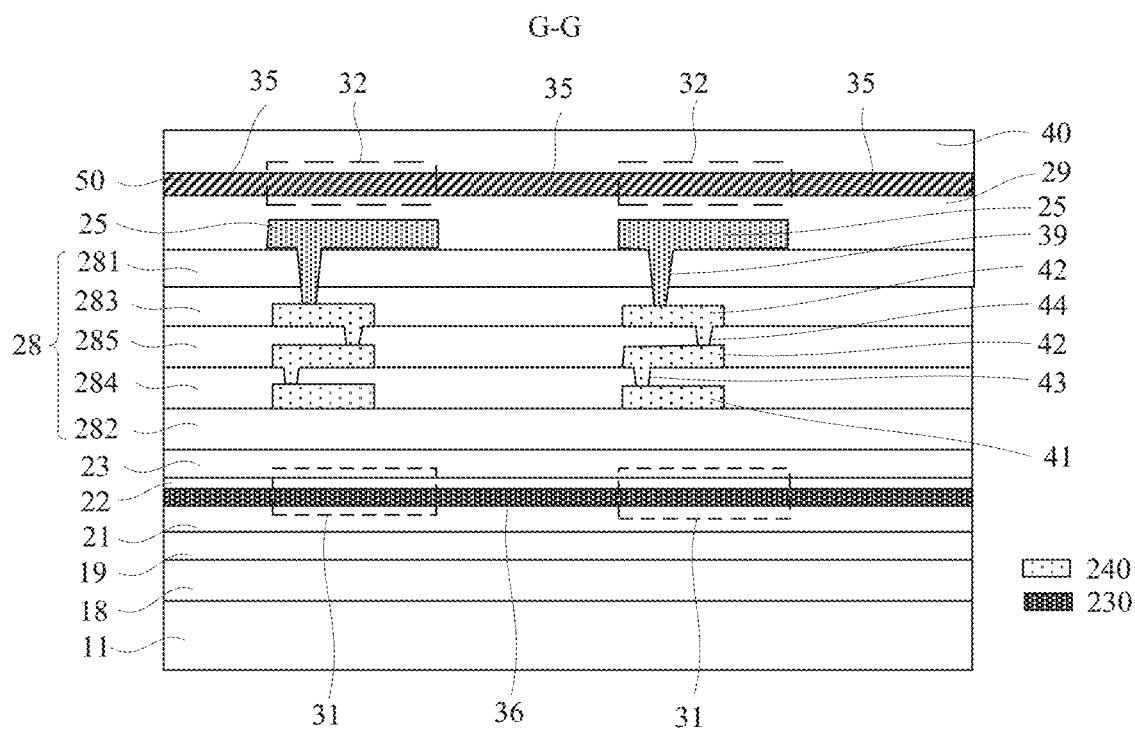
FIG. 11D is another sectional view of the cathodes in the light-transmissive area in FIG. 9 taken along the section line G-G.

As for the manner of forming the cathode connection structure(s) 35 by using the shielding connection structure(s) 36 each having the same shape as the respective cathode connection structure 35, in some embodiments, referring to FIG. 11A, the display panel 110 further includes at least one shielding connection structure 36, and the at least one shielding connection structure 36 and the shielding patterns 31 are made of a same material and disposed in a same layer. Referring to FIG. 11D, a shielding connection structure 36 corresponds to a cathode connection structure 35, and an orthogonal projection of the shielding connection structure 36 on the substrate 11 covers an orthogonal projection of the respective cathode connection structure 35 on the substrate 11. Referring to FIG. 11B, a shielding pattern 31 corresponds to a cathode 32, and the orthogonal projection of the shielding pattern 31 on the substrate 11 covers the orthogonal projection of the cathode 32 on the substrate 11. The shielding connection structure 36 and the shielding pattern 31 are made of a same material and disposed in a same layer, so that the shielding connection structure 36 may be fabricated while the patterned shielding pattern 31 is fabricated, which is not required to add additional processes and film layers, and is beneficial to reducing the manufacturing cost of the display panel.

For example, the shielding connection structure(s) 36 and the shielding patterns 31 may all be located in the semiconductor layer 210 or in the gate metal layer 220 or in the source-drain metal layer 230. In a case where there exist two gate metal layers 220, the shielding connection structure(s) 36 and the shielding patterns 31 may be located in either of the two gate metal layers 220. In a case where there exist two source-drain metal layers 230, the shielding connection structure(s) 36 and the shielding patterns 31 may be located in either of the two source-drain metal layers 230.

In some embodiments, the shielding connection structure(s) 36 and the shielding patterns 31 may also be disposed in different film layers. For example, the at least one shielding connection structure 36 may be disposed between the film layer in which the shielding patterns 31 are located and the anodes 25, or the at least one shielding connection structure 36 may be disposed between the substrate 11 and the film layer in which the shielding patterns 31 are located. For example, in a case where the anodes 23 are used as the shielding patterns 31 in the display panel 110, the at least one shielding connection structure 36 may be disposed between the substrate 11 and the anodes 25.

In a case where the display panel 110 includes a plurality of cathode connection strips 50, the display panel 110 includes a plurality of shielding connection structures 36 arranged in a plurality of rows, and each row includes multiple shielding connection structures 36 arranged in the first direction L1. Referring to FIG. 11A, each row of shielding connection structures 36 and portions of shielding patterns 31 connected to the shielding connection structures 36 in the row constitute a shielding connection strip 60. Referring to FIG. 11D, an orthogonal projection of a shielding connection strip 60 on the substrate 11 covers an orthogonal projection of a respective cathode connection strip 50 on the substrate 11.

Figure 10A:
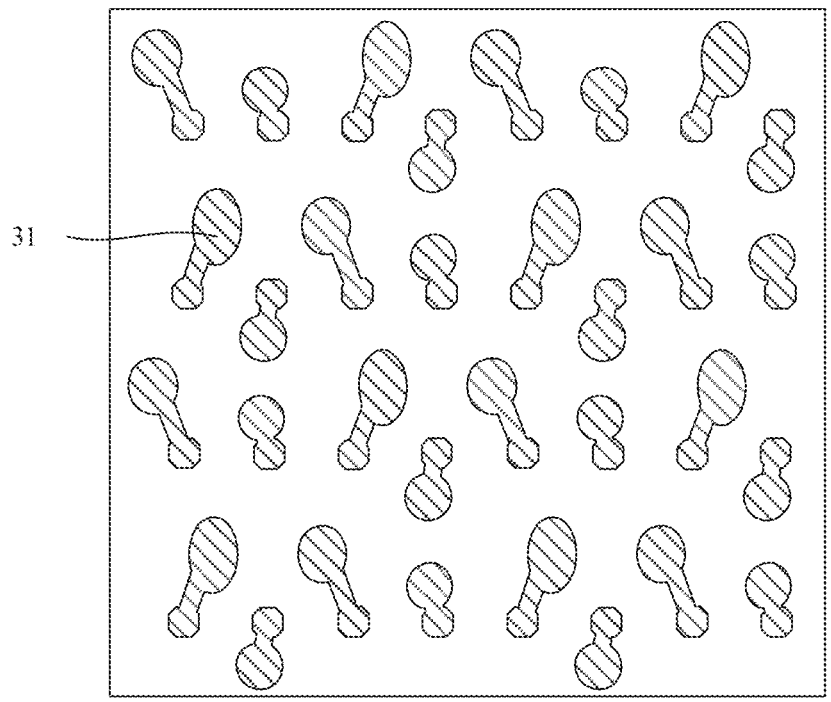
FIG. 10A is another top view of shielding patterns, in accordance with some embodiments.
Figure 10B:
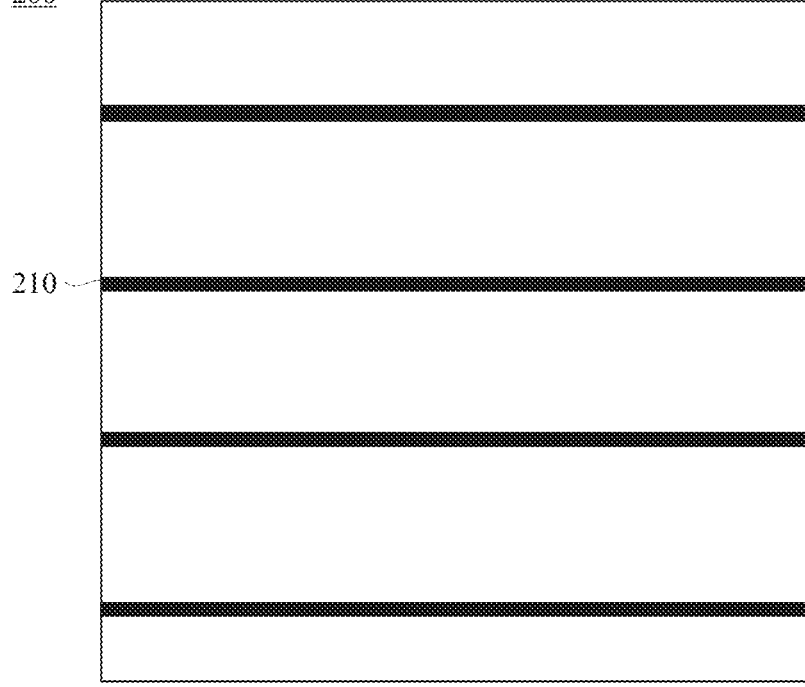
FIG. 10B is a schematic diagram of a mask, in accordance with some embodiments.

As for the manner of forming the cathode connection structure(s) 35 by using the mask 200, referring to FIGS. 9 and 10A, a shape of the shielding pattern 31 is substantially the same as the shape of the cathode 32. Referring to FIG. 10B, the mask 200 includes at least one light-shielding line 210. An orthogonal projection of each light-shielding line 210 on the substrate 11 is connected to orthogonal projections of at least two anodes 25 on the substrate 11. An orthogonal projection of each light-shielding line 210 on the substrate 11 covers an orthogonal projection of a respective cathode connection strip 50 on the substrate 11.

In some embodiments, referring to FIG. 7B, the anode 25 includes a first anode portion 251 and a second anode portion 252. A shape of the first anode portion 251 is substantially the same as a shape of an active light-emitting area 261 of a light-emitting device 302 where the first anode portion 251 is located, and a border of the first anode portion 251 is partially overlapped with the border of the anode 25.

The second anode portion 252 is electrically connected to the first anode portion 251. An end of the second anode portion 252 is electrically connected to the first anode portion 251, and another end thereof is used for being electrically connected to the thin film transistor.

In some embodiments, referring to FIG. 7A, the cathode 32 includes a first cathode portion 323 and a second cathode portion 324, and the second cathode portion 324 is electrically connected to the first cathode portion 323. Referring to FIG. 8A, an orthogonal projection of the first cathode portion 323 on the substrate 11 is covered by an orthogonal projection of the first anode portion 251 on the substrate 11, and an orthogonal projection of the second cathode portion 324 on the substrate 11 is covered by an orthogonal projection of the second anode portion 252 on the substrate 11.

Referring to FIG. 7A, in a case where the cathode 32 includes the cathode body portion 321 and the cathode connection portion 322, the first cathode portion 323 and the second cathode portion 324 constitute the cathode body portion 321. Referring to FIGS. 7A and 7B, a shape of the cathode body portion 321 is substantially the same as a shape of the anode 25.

Referring to FIGS. 9 and 7B, in a case where the display panel 110 further includes at least one cathode connection structure 35, the shape of the cathode 32 is substantially the same as the shape of the anode 25.

Figure 4:
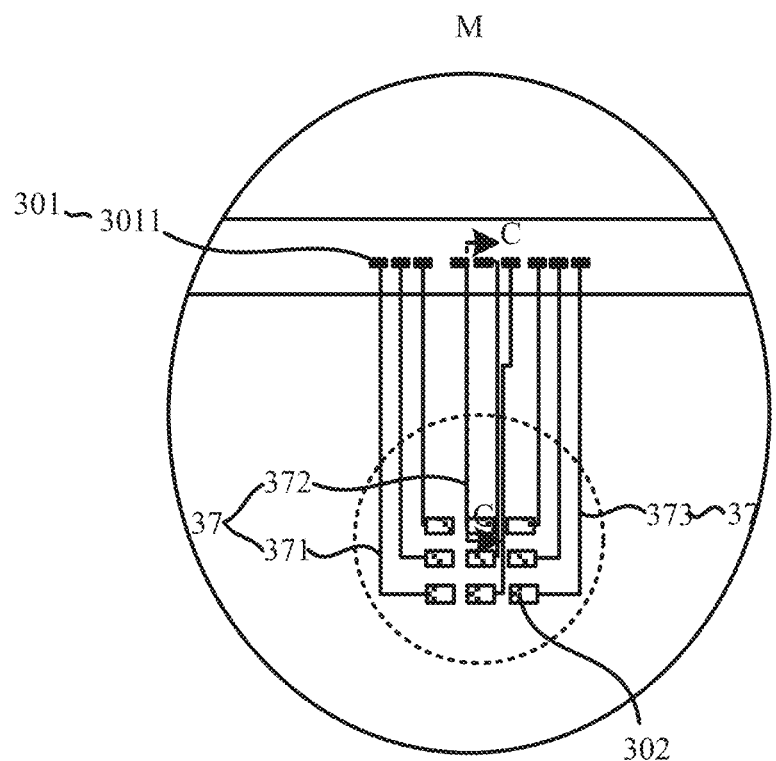
FIG. 4 is an enlarged view of the area M in FIG. 1.

In some embodiments, referring to FIG. 4, pixel circuits of the sub-pixels 30 in the light-transmissive area 101 are provided at a periphery of the light-transmissive area 101, which may increase the light transmittance of the light-transmissive area 101.

In order to distinguish pixel circuits 301 of the sub-pixels 30 in the light-transmissive area 101 and pixel circuits 301 of sub-pixels 30 in the main display area 102, the pixel circuits of the sub-pixels 30 in the light-transmissive area 101 are referred to as first pixel circuits 3011 (referring to FIG. 4), and the pixel circuits 301 of the sub-pixels 30 in the main display area 102 are referred to as second pixel circuits 3012 (referring to FIG. 3). In the above embodiments, the first pixel circuits 3011 of the sub-pixels 30 in the light-transmissive area 101 are disposed at the periphery of the light-transmissive area 101, and each light-emitting device 302 in the light-transmissive area 101 is electrically connected to a respective first pixel circuit 3011 by a respective connection wire 37 (referring to 371, 372 or 373 in FIG. 4).

Since there are multiple sub-pixels 30 in the light-transmissive area 101, a plurality of connection wires 37 are required. A film layer in which the connection wire 37 is located is referred as a connection wire layer 240 (referring to FIG. 5). The plurality of connection wires 37 may be disposed in a same connection wire layer 240, or in different connection wire layers 240, so as to provide a sufficient wiring space for the plurality of connection wires 37.

For example, the plurality of connection wires 37 include first connection wires 371, second connection wires 372 and third connection wires 373 that are respectively located in three connection wire layers 240, The first connection wire 371, the second connection wire 372 and the third connection wire 373 are used for electrically connecting the light-emitting devices 302 in different areas of the light-transmissive area 101 to respective first pixel circuits 3011.

Based on the above design, for example, referring to FIG. 5, a sectional structure of the light-transmissive area 10 of the display panel 110 and a peripheral area thereof is as follows. The display panel 110 includes a pixel circuit layer 70, a second insulating layer 282, the connection wire layer 240 and a third insulating layer 283 that are sequentially arranged in a direction perpendicular to the substrate 11 and pointing from the substrate 11 to the anodes 25, and are disposed between the substrate 11 and a film layer where the plurality of anodes 25 are located. The pixel circuit layer 70 includes the semiconductor layer 210, the gate insulating layer 18, the first gate metal layer 221, the first interlayer insulating layer 19, the second gate metal layer 222, the second interlayer insulating layer 21, the first source-drain metal layer 231, the passivation layer 22, the planarization layer 23, and the second source-drain metal layer 232.

The pixel circuit layer 70 includes a plurality of first pixel circuits 3011 disposed at the periphery of the light-transmissive area 101. A plurality of second via holes 38 are provided in the second insulating layer 282, and a plurality of third via holes 39 are provided in the third insulating layer 283. A first end of the connection wire 37 in the connection wire layer 240 is electrically connected to the first pixel circuit 3011 through at least one second via hole 38, and a second end thereof is electrically connected to the second anode portion 252 of the anode 25 through at least one third via hole 39.

Figure 5:
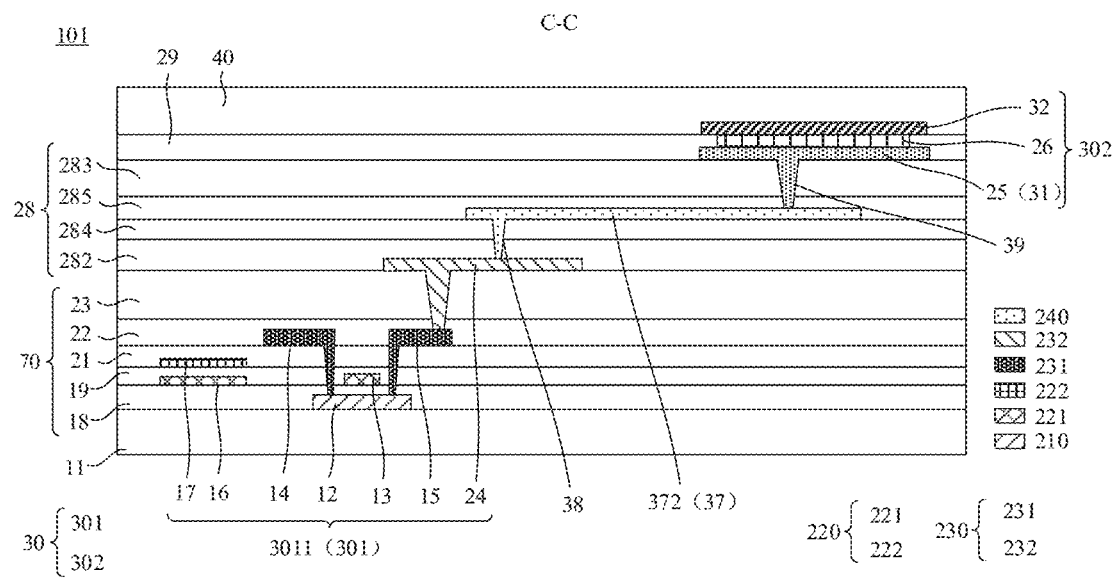
FIG. 5 is a sectional view of the area M in FIG. 4 taken along the section line C-C.

In an example where the display panel 110 includes three connection wire layers 240, referring to FIGS. 4 and 5, the three connection wire layers 240 are sequentially a first connection wire layer, a second connection wire layer and a third connection wire layer in the direction perpendicular to the substrate 11 and pointing from the substrate 11 to the anode. The first connection wire layer includes a plurality of first connection wires 371, the second connection wire layer includes a plurality of second connection wires 372, and the third connection wire layer includes a plurality of third connection wires 373. A fourth insulating layer 284 is provided between the first connection wire layer and the second connection wire layer, and a fifth insulating layer 285 is provided between the second connection wire layer and the third connection wire layer.

With continued reference to FIG. 5, as for the second connection wire 372, the second via hole 38 extends through the fourth insulating layer 284 in addition to the second insulating layer 282, so that the second connection wire 372 is electrically connected to the first pixel circuit 3011 through the second via hole 38; the third via hole 39 extends through the fifth insulating layer 285 in addition to the third insulating layer 283, so that the second connection wire 372 is electrically connected to the anode 25 through the third via hole 39.

For example, referring to FIG. 8A, in a case where the display panel 110 further includes the transparent conductive layer 33, the transparent conductive layer 33 is located at a side of the third insulating layer 283 away from the substrate 11. In a case where the display panel 110 includes three connection wire layers 240, the transparent conductive layer 33 is located on a side of the fifth insulating layer 285 away from the substrate 11, This facilitates electrical connection of the cathodes 32 to the transparent conductive layer 33. The transparent conductive layer 33 may also be disposed at any position below the anode 25, and the position is not limited thereto in the present disclosure.

For example, the orthogonal projection of the first via hole 34 for connecting the cathode connection portion 322 and the transparent conductive layer 33 on the substrate 11 is not overlapped with an orthogonal projection of the third via hole 39 for connecting the second anode portion 252 and the connection wire 37 on the substrate 11, so that the cathode 32 and the anode 25 are kept electrically insulated.

As shown in FIG. 8A, the connection wire layer 240 further includes a plurality of pads 41, each pad 41 is electrically connected to a second end of a respective connection wire 37, and each pad 41 is electrically connected to a second anode portion 252 of a respective anode 25 through a respective third via hole 39. In the case where the display panel 110 includes a plurality of cathode connection strips 50, as shown in FIGS. 9, 11C and 11D, both orthogonal projections of the third via hole 39 and the pad 41 on the substrate 11 are at least partially overlapped with an orthogonal projection of a cathode connection strip 50 on the substrate 11. In this case, the second anode portion 252 may be electrically connected to the pad 41 through the third via hole 39, thereby making the anode 25 electrically connected to the connection wire 37.

In a case where the display panel 110 includes a plurality of connection wire layers 240, as for the first pixel circuit 3011 and the anode 25 of the light-emitting device 302 that need to be electrically connected by the connection wire, as shown in FIGS. 8A and 110, in addition to providing the pad 41 in the connection wire layer 240 where the connection wire 37 has been provided, an auxiliary pad 42 may also be provided at a respective position of another connection wire layer, and the first pixel circuit 3011 is electrically connected to an anode of a respective light-emitting device 302 by the connection wire 37, the pad 41 and the auxiliary pad 42.

With continued reference to FIG. 8A, in an example where the display panel 110 includes three connection wire layers 240, and the connection wire 37 for electrically connecting the first pixel circuit 3011 and the anode 25 of the light-emitting device 302 is located in the connection wire layer 240 closest to the substrate 11 in the three connection wire layers 240 (that is, the connection wire 37 is the first connection wire 371 in the first connection wire layer (referring to FIG. 4)), a pad 41 electrically connected to the first connection wire 371 may be provided in the first connection wire layer, and besides, an auxiliary pad 42 may be provided in each of the second connection wire layer and the third connection wire layer. In this way, the first pixel circuit 3011 may be electrically connected to the anode 25 through the connection wire 37, the pad 41 and the two auxiliary pads 42 in sequence.

In the above embodiments, through a connection function of the pad 41 and the auxiliary pads 42, it is possible to prevent the via hole between the first pixel circuit 3011 and the anode 25 of the light-emitting device 302 from being too deep, thereby improving the reliability of the electrical connection between the anode 25 and the first pixel circuit 3011.

For example, an orthogonal projection of the auxiliary pad 42 on the substrate 11 is at least partially overlapped with, e.g., completely overlapped with an orthogonal projection of a respective pad 41 on the substrate 11, so that an occupied area of the pad 41 and the auxiliary pads 42 may be minimized. In addition, the via holes (referring to the via holes 43 and 44 in FIG. 8A) for electrically connecting two adjacent conductive blocks (including the pad 41 and the auxiliary pad) may be staggered in a direction perpendicular to the substrate 11. In this way, it is possible to avoid that orthogonal projections of two adjacent via holes on the substrate 11 are overlapped with each other, thereby further improving the reliability of the electrical connection.

For example, with continued reference to FIG. 8A, in the example where the display panel 110 includes three connection wire layers 240, and the connection wire 37 for electrically connecting the first pixel circuit 3011 and the anode 25 of the light-emitting device 302 is located in the connection wire layer 240 closest to the substrate 11 in the three connection wire layers 240, two auxiliary pads 42 are provided on a side of the pad 41 away from the substrate 11. The pad 41 is connected to an adjacent auxiliary pad 42 through a fourth via hole 43. The two adjacent auxiliary pads 42 are connected to each other through a fifth via hole 44. The second anode portion 252 is connected to the auxiliary pad 42 farther away from the pad 41 through the third via hole 39. The orthogonal projection of the third via hole 39 on the substrate 11 is not overlapped with an orthogonal projection of the fifth via hole 44 on the substrate 11, and the orthogonal projection of the fifth via hole 44 on the substrate 11 is not overlapped with an orthogonal projection of the fourth via hole 43 on the substrate, so that two via holes adjacent to each other in the direction perpendicular to the substrate 11 are prevented from being located at a same position, thereby further improving the reliability of the electrical connection between the anode 25 and the first pixel circuit 3011.

In some embodiments, referring to FIG. 6A, the plurality of sub-pixels 30 of the display panel 110 include a plurality of red sub-pixels 303, a plurality of green sub-pixels 304 and a plurality of blue sub-pixels 305. A shape of a first cathode portion 323 of a cathode 32 of a light-emitting device 302 of the green sub-pixel 304 is substantially a circle: a shape of a first cathode portion 323 of a cathode 32 of a light-emitting device 302 of the red sub-pixel 303 is substantially an ellipse, and a shape of a first cathode portion 323 of a cathode 32 of a light-emitting device 302 of the blue sub-pixel 305 is substantially a circle or an ellipse.

It will be noted that shapes of first cathode portions 323 of the red sub-pixel 303, the green sub-pixel 304 and the blue sub-pixel 305 are not limited thereto. For example, the shape of the first cathode portion 323 of the green sub-pixel 304 may also be an ellipse, a square, a hexagon, etc.; the shape of the first cathode portion 323 of the red sub-pixel 303 may also be a circle, a square, a hexagon, etc.; and the shape of the first cathode portion 323 of the blue sub-pixel 305 may also be a square, a hexagon, etc.

In some embodiments, a minimum distance between first cathode portions 323 of two green sub-pixels 304 is less than a minimum distance between first cathode portions of two sub-pixels of another same color, Referring to FIG. 6A, the minimum distance D1 between the first cathode portions 323 of the two green sub-pixels 304 is less than the minimum distance D2 between the first cathode portions 323 of the two red sub-pixels 303, and is also less than the minimum distance D3 between the first cathode portions 323 of the two blue sub-pixels 305.

In some embodiments, referring to FIG. 6A, active light-emitting areas of light-emitting devices 302 of the red sub-pixels 303 and the blue sub-pixels 305 are alternately arranged in the first direction L1; and active light-emitting areas of light-emitting devices 302 of the green sub-pixels 304 are arranged in the second direction L2. An orthogonal projection of an active light-emitting area of a sub-pixel 30 on the substrate 11 is covered by the orthogonal projection of the cathode body portion 321 on the substrate 11.

It will be noted that in sectional views of FIGS. 5, 6C, 8A, 80, 80, 11B, 11C and 11D in this text, a plurality of insulating layers are shown between the film layer where the plurality of anodes 25 are located and the substrate 11 and these sectional views are schematically shown based on a background that the display panel 110 includes conductive film layers, i.e., two gate metal layers, two source-drain metal layers and three connection wire layers. In fact, the number of insulating layers between the film layer where the plurality of anodes 25 of the display panel 110 are located and the substrate 11 in the embodiments of the present disclosure is not limited thereto. In a case where the display panel 110 adopts other film structures, the number of insulating layers may be reduced or increased.

Some embodiments of the present disclosure provide a method for manufacturing a display panel. The method includes following steps.

In S100, a plurality of shielding patterns 31 separated from each other are fabricated on a substrate 11.

The shielding patterns 31 may be the shielding patterns 31 in any of the above embodiments. The shielding patterns 31 may be fabricated through processes such as vapor deposition, exposure and etching, which are not specifically limited herein.

Figure 18:
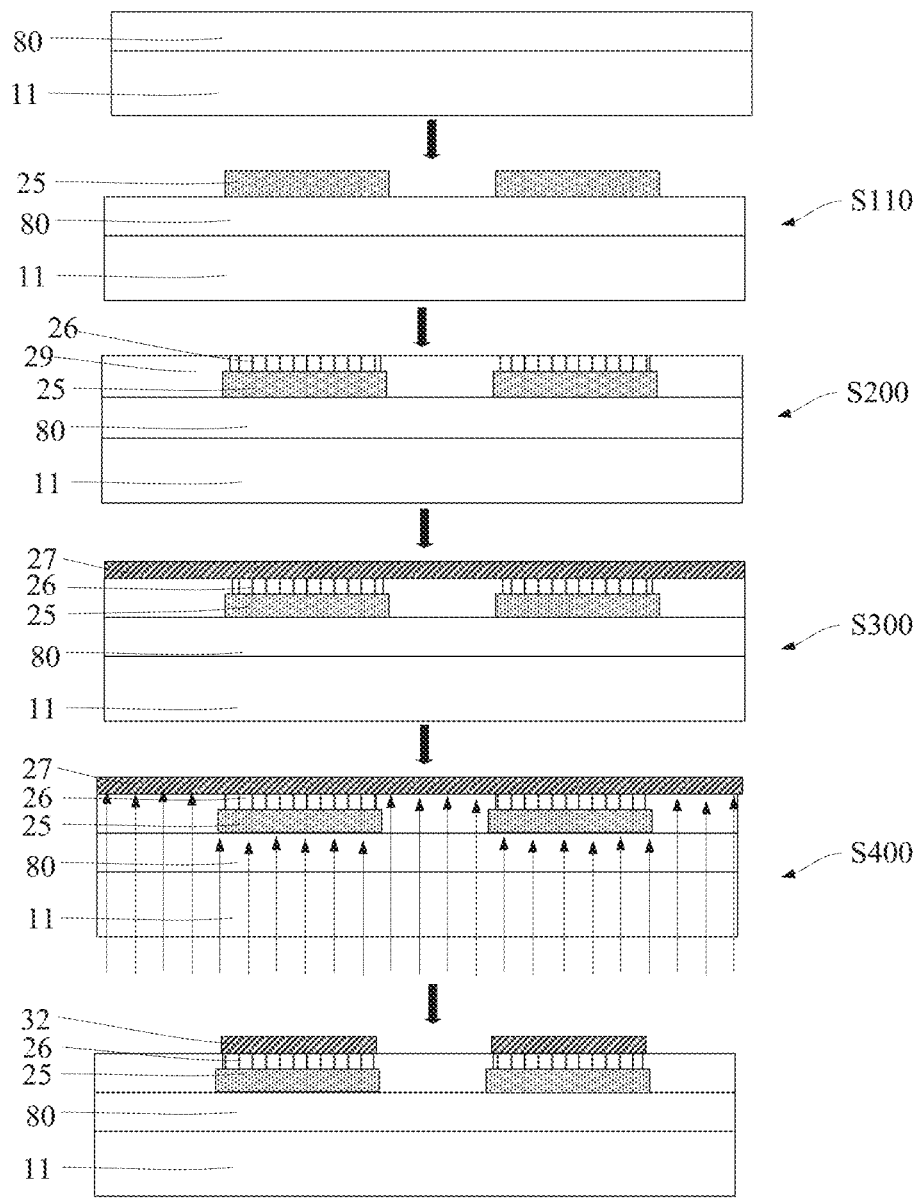
FIG. 18 is a schematic diagram showing steps of manufacturing a display panel, in accordance with some embodiments.
Figure 19:
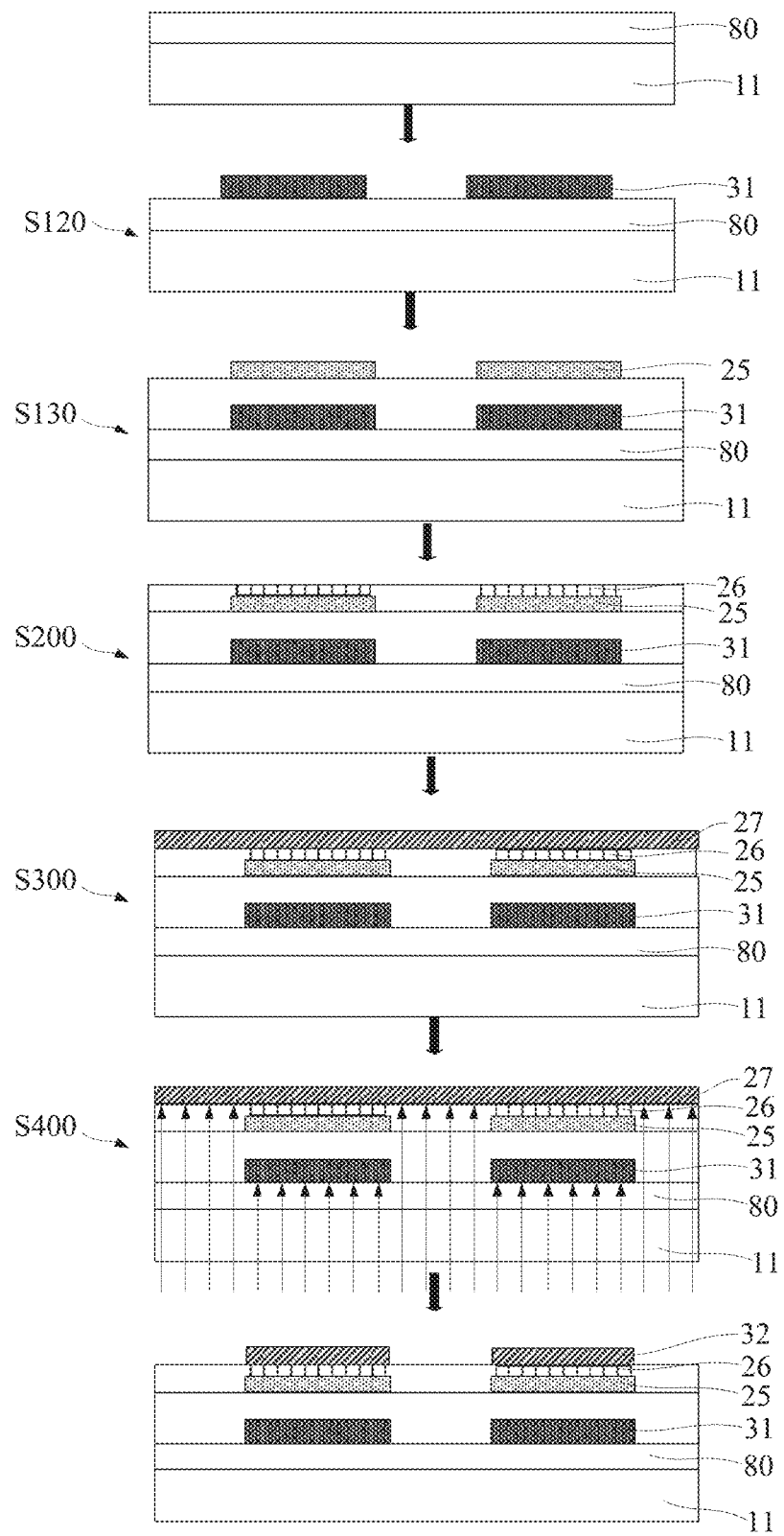
FIG. 19 is another schematic diagram showing steps of manufacturing a display panel, in accordance with some embodiments.
Figure 20:
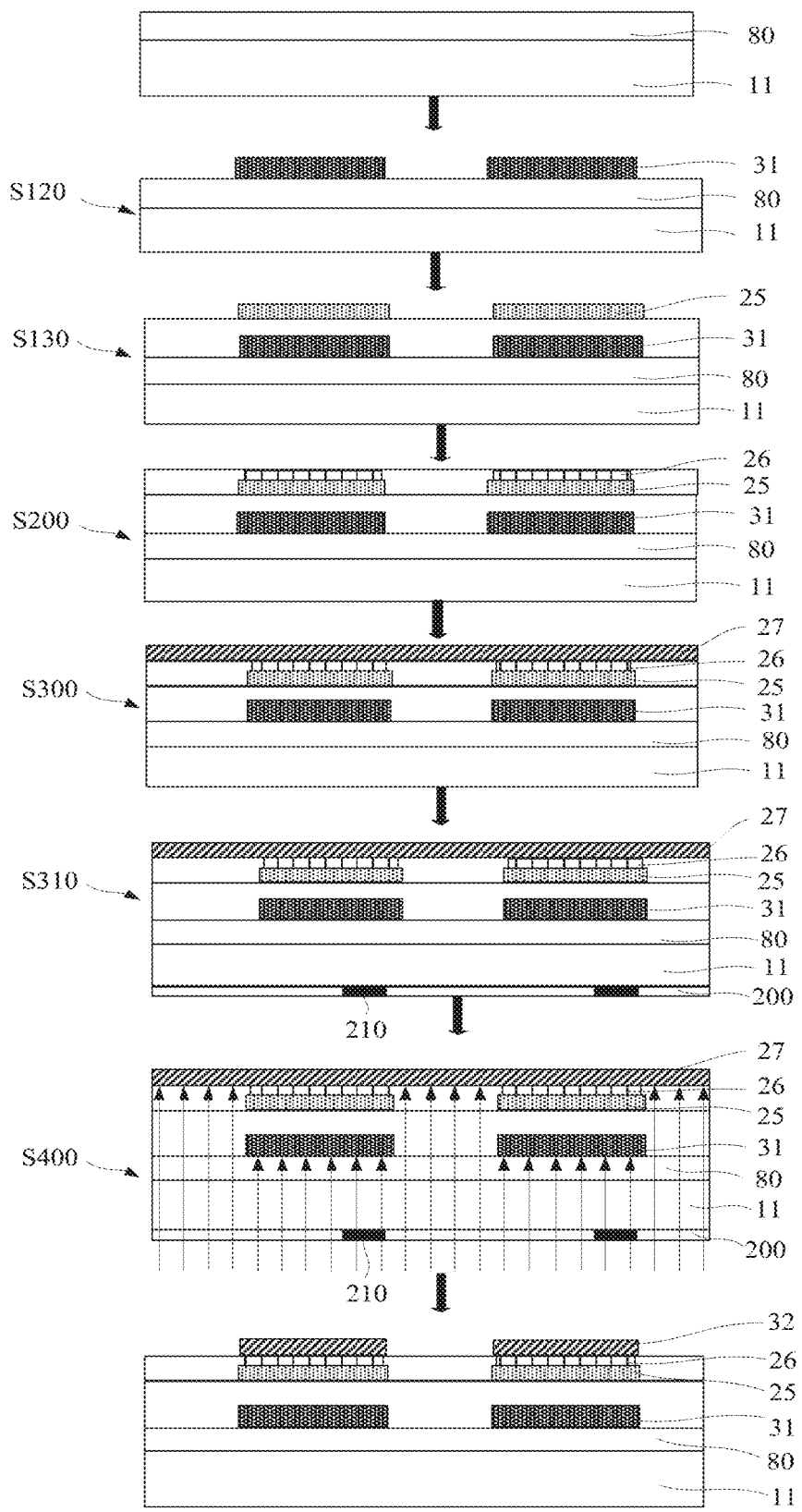
FIG. 20 is yet another schematic diagram showing steps of manufacturing a display panel, in accordance with some embodiments.

Before the shielding patterns 31 are fabricated, one or more conductive film layers and one or more insulating layers 80 need to be fabricated on the substrate 11. The one or more conductive film layers may be at least one of a semiconductor layer 210, gate metal layers 220, source-drain metal layers 230 and other conductive film layers. At least one insulating layer 80 is provided between every two adjacent conductive film layers. In a case where first pixel circuits 3011 of sub-pixels 30 in the light-transmissive area 101 of the display panel 110 are disposed at a periphery of the light-transmissive area 101, conductive patterns for forming the first pixel circuits in the above conductive film layers may exist in the main display area 102 of the display panel 110. FIGS. 18 to 20 each show a sectional structure of the light-transmissive area of the display panel 110, and thus the above conductive film layers cannot be seen in FIGS. 18 to 20, but only the insulation layer 80 can be seen.

In S200, a plurality of light-emitting layers 26 are fabricated on a side of the plurality of shielding patterns 31 away from the substrate 11. Each light-emitting layer 26 corresponds to a light-emitting device 302.

In the above step, the plurality of light-emitting layers 26 may be fabricated by using an evaporation or inkjet printing process.

It will be noted that, before fabricating the plurality of light-emitting layers 26, a step of fabricating a pixel defining layer 29 is also included. The pixel defining layer 29 includes a plurality of opening areas, and each opening area defines an active light-emitting area 261 of a light-emitting device 302.

In S300, a cathode film 27 is fabricated on a side of the plurality of light-emitting layers 26 away from the substrate 11. The cathode film 27 covers a display area 10 of the display panel 110.

In the above step, the cathode film 27 may be fabricated by using an evaporation process.

In S400, an area of the substrate 11 corresponding to the light-transmissive area 101 of the display panel 110 is irradiated from a side of the substrate 11 away from the cathode film 27 by using a laser beam to remove portions that are not shielded by the plurality of shielding patterns 31 in a portion of the cathode film 27 located in the area, so as to form a plurality of cathodes 32 separated from each other.

Orthogonal projections of the shielding patterns 31 on the substrate 11 cover orthogonal projections of the plurality of cathodes 32 separated from each other on the substrate 11, respectively.

Each light-emitting layer 26 in the light-transmissive area and a respective cathode 32 form a portion of a light-emitting device 302. Each light-emitting device 302 has an active light-emitting area, and an orthogonal projection of the active light-emitting area on the substrate 11 is located within an orthogonal projection of the cathode 32 of the light-emitting device 302 on the substrate 11.

In some embodiments, the cathode film 27 is capable of transmitting visible light and absorbing infrared light. The shielding pattern 31 is capable of absorbing infrared light. The laser beam is an infrared beam.

An orthogonal projection of the shielding pattern 31 on the substrate 11 and the orthogonal projection of the cathode 32 on the substrate 11 are substantially the same in shape and size, and the orthogonal projections of the shielding patterns 31 on the substrate 11 cover the orthogonal projections of the plurality of cathodes 32 separated from each other on the substrate 11, respectively. Patterning processes such as vapor deposition and etching may be performed to form the shielding patterns 31, and fabricating accuracy of the processes is high, Shapes of the plurality of cathodes 32 may be controlled by precisely controlling shapes of the shielding patterns 31, so as to improve the accuracy of patterning the cathode film 27, improve an aperture ratio of a film layer in which the plurality of cathodes 32 are located, and improve a transmittance of the film layer in which the plurality of cathodes 32 are located to visible light.

Figure 15:
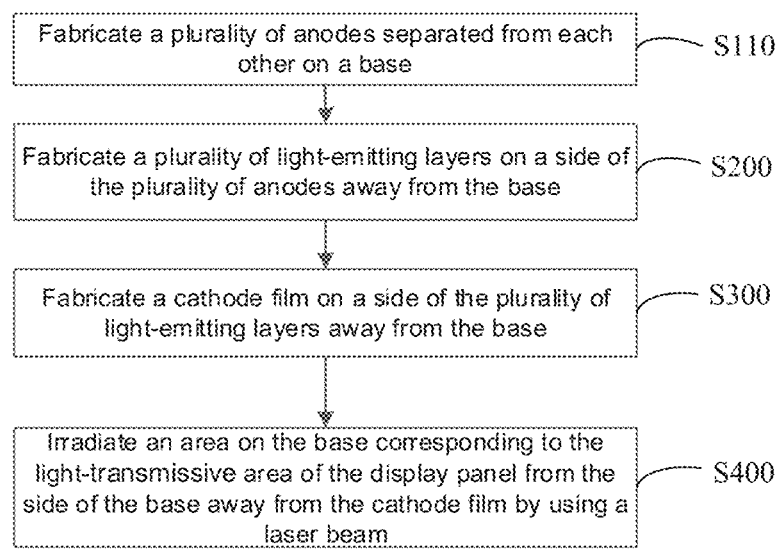
FIG. 15 is a flowchart of a method for manufacturing a display panel, in accordance with some embodiments.
Figure 16:
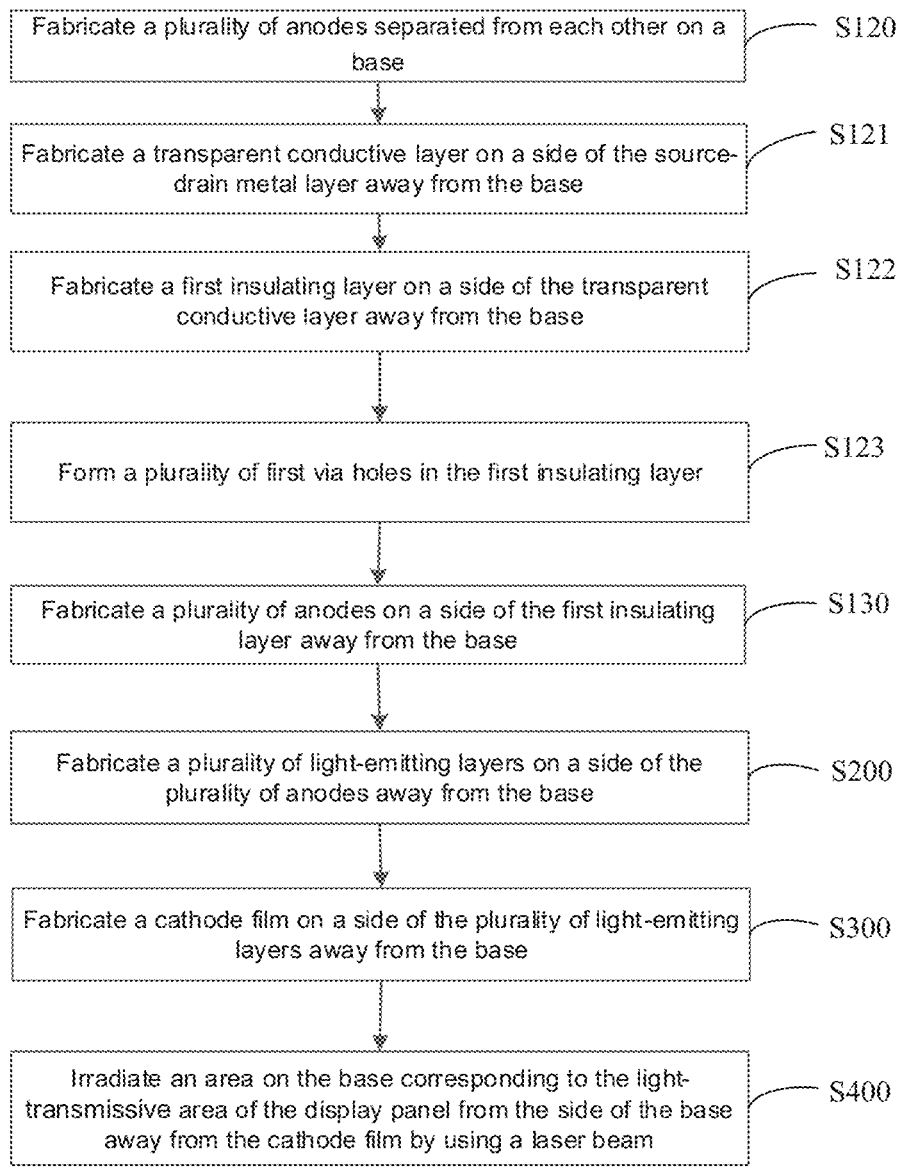
FIG. 16 is another flowchart of a method for manufacturing a display panel, in accordance with some embodiments.

In some embodiments, as shown in FIGS. 15 and 18, an anode is used as the shielding pattern 31, and then S100 (in which the plurality of shielding patterns 31 separated from each other are fabricated on the substrate 11) includes S110.

In S110, a plurality of anodes 25 separated from each other are fabricated on the substrate 11.

Each light-emitting device 302 includes an anode 25, and one anode 25 forms one shielding pattern 31.

In a case where one anode 25 forms one shielding pattern 31, referring to FIGS. 15 and 18, the method for manufacturing the display panel 110 includes:

S110, fabricating the plurality of anodes 25 separated from each other on the substrate 11;

S200, fabricating the plurality of light-emitting layers 26 on a side of the plurality of anodes 25 away from the substrate 11;

S300, fabricating the cathode film 27 on a side of the plurality of light-emitting layers 26 away from the substrate 11; and S400, irradiating the area of the substrate 11 corresponding to the light-transmissive area 101 of the display panel 110 from the side of the substrate 11 away from the cathode film 27 by using a laser beam.

In the case where one anode 25 forms one shielding pattern 31, the one or more insulating layers 80 include at least all insulating layers in a pixel circuit layer 70 and at least one insulating layer between the pixel circuit layer 70 and a film layer in which the anodes 25 are located. For example, referring to FIG. 5, all the insulating layers in the pixel circuit layer 70 include a gate insulating layer 18, a first interlayer insulating layer 19, a second interlayer insulating layer 21, a passivation layer 22 and a planarization layer 23; and the at least one insulating layer 28 includes a second insulating layer 282, a fourth insulating layer 284, a fifth insulating layer 285 and a third insulating layer 283. The one or more insulating layers 80 may further include other insulating layers, which will not be listed herein.

In some embodiments, as shown in FIGS. 16, 17, 19 and 20, in a case where the light-emitting device 302 includes the anode 25 and a plurality of shielding patterns 31 are located on a side of the anodes 25 of the light-emitting devices 302 proximate to the substrate 11, S100 (in which the plurality of shielding patterns 31 separated from each other are fabricated on the substrate 11) includes S120.

In S120, a patterned semiconductor layer 210, patterned gate metal layer(s) 220 and patterned source-drain metal layer(s) 230 are fabricated on the substrate 11, and the plurality of shielding patterns 31 are formed in a process of forming the patterned semiconductor layer 210 or gate metal layer 220 or source-drain metal layer 230. The source-drain metal layer(s) 230 are farther away from the substrate 11 than the semiconductor layer 210 and the gate metal layer(s) 220.

Between S100 (in which the plurality of shielding patterns 31 separated from each other are fabricated on the substrate 11) and S200 (in which the plurality of light-emitting layers 26 are fabricated), the method further includes S130.

In S130, a plurality of anodes 25 are fabricated on the substrate 11. Each light-emitting device 302 includes an anode 25.

In some embodiments, in a case where the plurality of cathodes 32 are electrically connected through a transparent conductive layer 33, between S100 (in which the plurality of shielding patterns 31 separated from each other are fabricated on the substrate 11) and S130 (in which the plurality of anodes are fabricated), the method further includes S121 to S123.

In S121, the transparent conductive layer 33 is fabricated on a side of the source-drain metal layer 230 away from the substrate 11.

In S122, a first insulating layer 281 is fabricated on a side of the transparent conductive layer 33 away from the substrate 11.

In S123, a plurality of first via holes 34 are formed in the first insulating layer 281.

A gap exists between an orthogonal projection of each first via hole 34 on the substrate 11 and an orthogonal projection of an adjacent anode 25 on the substrate 11. The orthogonal projection of each first via hole 34 on the substrate 11 is located within an orthogonal projection of a respective shielding pattern 31 on the substrate 11, and the plurality of first via holes 34 extend through the first insulating layer 281 to be connected to the transparent conductive layer 33.

In a case of forming the plurality of first via holes 34 in the first insulating layer 281, during a process of S300 (fabricating the cathode film 27 on the side of the plurality of light-emitting layers 26 away from the substrate 11), a material of the cathode film 27 enters the plurality of first via holes 34, so that the cathode film 27 is connected to the transparent conductive layer 33 through the cathode material in the plurality of first via holes 34.

Figure 17:
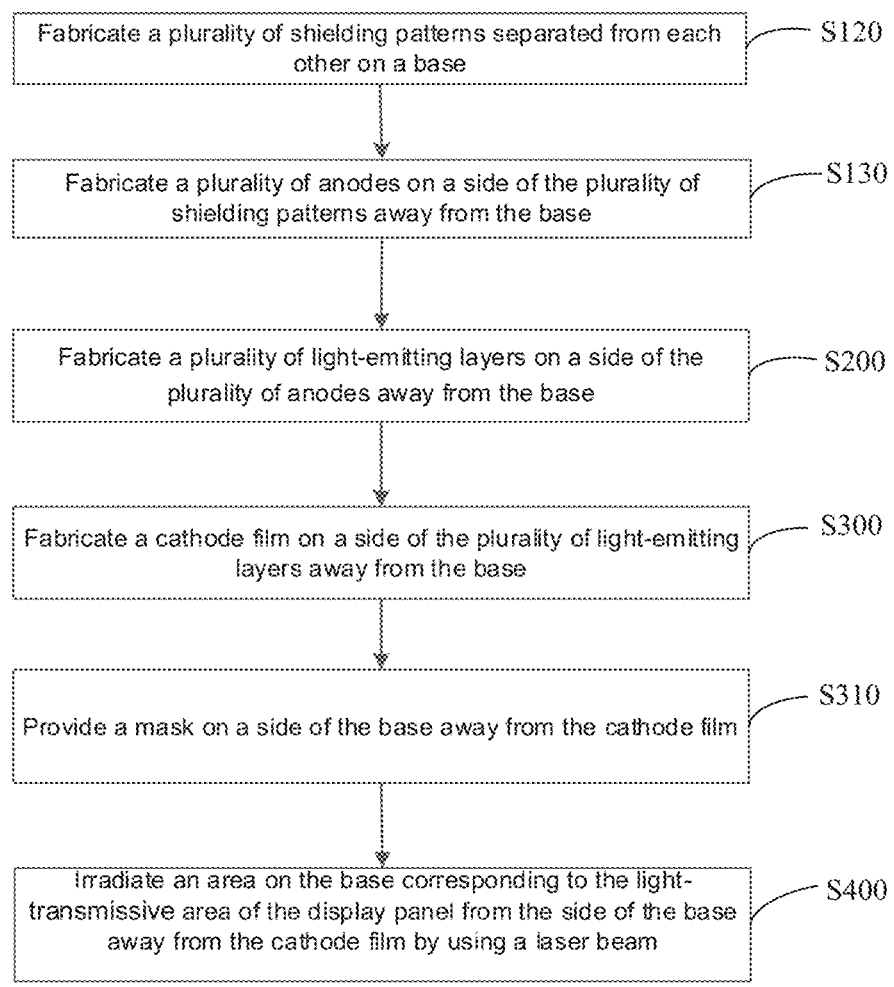
FIG. 17 is yet another flowchart of a method for manufacturing a display panel, in accordance with some embodiments.

Referring to FIGS. 17 and 19, in a case where the shielding patterns 31 are located in the semiconductor layer 210 or the gate metal layer 220 or the source-drain metal layer 230, the method for manufacturing the display panel 110 includes;

S120, forming the plurality of shielding patterns 31 in a process of fabricating the patterned semiconductor layer 210 or gate metal layer 220 or source-drain metal layer 230 on the substrate 11;

S121, fabricating the transparent conductive layer 33 on the side of the source-drain metal layer 230 away from the substrate 11;

S122, fabricating the first insulating layer 281 on the side of the transparent conductive layer 33 away from the substrate 11;

S123, forming the plurality of first via holes 34 in the first insulating layer 281;

S130, fabricating the plurality of anodes 25 on the substrate 11;

S200, fabricating the plurality of light-emitting layers 26 on the side of the plurality of anodes 25 away from the substrate 11;

S300, fabricating the cathode film 27 on the side of the plurality of light-emitting layers 26 away from the substrate 11; and S400, irradiating the area of the substrate 11 corresponding to the light-transmissive area 101 of the display panel 110 from the side of the substrate 11 away from the cathode film 27 by using a laser beam.

In the above embodiments, the shielding pattern 31 is disposed on a side of the anode 25 proximate to the substrate 11, and the orthogonal projection of the shielding pattern 31 on the substrate 11 covers the orthogonal projection of the anode 25 on the substrate 11.

In this case, the one or more insulating layers 80 include an insulating layer between the substrate 11 and a film layer in which the shielding patterns 31 are located. For example, in a case where the shielding patterns 31 are located in a film layer in which the gate metal layer 220 is located, the one or more insulating layers 80 include the gate insulating layer 18.

In some embodiments, the plurality of cathodes 32 separated from each other are electrically connected by cathode connection structure(s) 35 disposed in a same layer as the cathodes 32. In this case, the cathode connection structure(s) 35 and the cathodes 32 may be formed in the following two manners.

In a first manner, as shown in FIG. 11A, a plurality of shielding connection structures 36 are formed in the process of forming the patterned semiconductor layer 210 or gate metal layer 220 or source-drain metal layer 230. The plurality of shielding connection structures 36 and the shielding patterns 31 are located in a same film layer. A dimension of each shielding connection structure 36 in a first direction L1 is greater than a dimension thereof in a second direction L2. The first direction L1 is a row direction in which a plurality of sub-pixels 30 of the display panel 110 are arranged, and the second direction L2 is a column direction in which the plurality of sub-pixels 30 of the display panel 110 are arranged. Each shielding connection structure 36 is connected to two shielding patterns 31. The plurality of shielding connection structures 36 are arranged in a plurality of rows, and each row includes multiple shielding connection structures 36 arranged in the first direction L1. Each row of shielding connection structures 36 and portions of shielding patterns 31 connected to the shielding connection structures 36 in this row form a shielding connection strip 60.

In the above manner, after S400 (in which the area of the substrate 11 corresponding to the light-transmissive area 101 of the display panel 110 is irradiated from the side of the substrate 11 away from the cathode film 27 by using a laser beam), referring to FIG. 9, it is possible to form the plurality of cathodes 32 and the plurality of cathode connection structures 35 through the cathode film 27. The plurality of cathode connection structures 35 and the plurality of cathodes 32 are located in a same film layer, and a dimension of each cathode connection structure 35 in the first direction L1 is greater than a dimension thereof in the second direction L2. Each cathode connection structure 35 is electrically connected to two cathodes 32. The plurality of cathode connection structures 35 are arranged in a plurality of rows, and each row includes multiple cathode connection structures 35 arranged in the first direction L1. Each row of cathode connection structures 35 and portions of cathodes 32 connected to the cathode connection structures 35 in this row form a cathode connection strip 50.

In a second manner, as shown in FIGS. 17 and 20, before S400 (in which the area of the substrate 11 corresponding to the light-transmissive area 101 of the display panel 110 is irradiated from the side of the substrate 11 away from the cathode film 27 by using a laser beam), the method for manufacturing the display panel further includes S310.

In S310, a mask 200 is provided on a side of the substrate 11 away from the cathode film 27.

The mask 200 includes at least one light-shielding line 210, an orthogonal projection of each light-shielding line 210 on the substrate 11 is connected to orthogonal projections of at least two anodes 25 on the substrate 11.

In the above manner, referring to FIG. 9, it is also possible to form the plurality of cathodes 32 and the plurality of cathode connection structures 35 through the cathode film 27. The plurality of cathode connection structures 35 and the plurality of cathodes 32 are located in the same film layer, and the dimension of each cathode connection structure 35 in the first direction L1 is greater than the dimension thereof in the second direction L2. Each cathode connection structure 35 is electrically connected to two cathodes 32. The plurality of cathode connection structures 35 are arranged in a plurality of rows, and each row includes multiple cathode connection structures 35 arranged in the first direction L1, Each row of cathode connection structures 35 and portions of cathodes 32 connected to the cathode connection structures 35 in this row form a cathode connection strip 50.

Referring to FIGS. 18 and 20, in a case of using the mask 200 to form the cathode connection structures 35, the method for manufacturing the display panel 110 includes:

S120, forming the plurality of shielding patterns 31 in a process of fabricating the patterned semiconductor layer 210 or gate metal layer 220 or source-drain metal layer 230 on the substrate 11;

S130, fabricating the plurality of anodes 25 on the substrate 11;

S200, fabricating the plurality of light-emitting layers 26 on the side of the plurality of anodes 25 away from the substrate 11;

S300, fabricating the cathode film 27 on the side of the plurality of light-emitting layers 26 away from the substrate 11;

S310, providing the mask 200 on the side of the substrate 11 away from the cathode film 27; and S400, irradiating the area of the substrate 11 corresponding to the light-transmissive area 101 of the display panel 110 from the side of the substrate 11 away from the cathode film 27 by using a laser beam.

The foregoing descriptions are merely specific implementations of the present disclosure, but the protection scope of the present disclosure is not limited thereto. Changes or replacements that any person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display panel having a display area including a light-transmissive area and a main display area located at a periphery of the light-transmissive area, the display panel comprising:
   a substrate;
   a plurality of shielding patterns disposed on the substrate and located in the light-transmissive area, orthogonal projections of the plurality of shielding patterns on the substrate being separated from each other;
   a plurality of light-emitting layers disposed in the light-transmissive area and on the substrate;
   a plurality of cathodes disposed in the light-transmissive area and located on a side of the plurality of light-emitting layers away from the substrate; each light-emitting layer and a respective cathode constituting a portion of a light-emitting device, the light-emitting device having an active light-emitting area, and an orthogonal projection of the active light-emitting area on the substrate being located within an orthogonal projection of a cathode of the light-emitting device on the substrate; and
   at least one cathode connection structure made of a same material as the cathode and disposed in a same layer as the cathode, wherein
   the cathode is located at a side of a respective shielding pattern away from the substrate, and an orthogonal projection of the shielding pattern on the substrate covers the orthogonal projection of the cathode on the substrate;
   the shielding pattern is located on a side of the light-emitting layer proximate to the substrate, and the shielding pattern is further used as an anode of the light-emitting device;
   a dimension of the cathode connection structure in a first direction is greater than a dimension of the cathode connection structure in a second direction, wherein the first direction is a row direction in which a plurality of sub-pixels of the display panel are arranged, and the second direction is a column direction in which the plurality of sub-pixels of the display panel are arranged;
   each cathode connection structure is electrically connected to two cathodes adjacent to the cathode connection structure;
   the at least one cathode connection structure includes a plurality of cathode connection structures arranged in a plurality of rows, and each row includes cathode connection structures arranged in the first direction; and
   each row of cathode connection structures and portions of cathodes connected to the cathode connection structures in the row constitute a cathode connection strip; and in the second direction, the cathode connection strip has substantially a same dimension as each cathode connection structure.

2. The display panel according to claim 1, wherein
   a transmittance of the cathode to visible light is greater than a transmittance of the cathode to infrared light; and
   a transmittance of the shielding pattern to infrared light is less than or equal to 2%.

3. The display panel according to claim 1, further comprising:
   a plurality of shielding connection structures arranged in a plurality of rows, wherein the plurality of shielding connection structures are made of a same material as the plurality of shielding patterns and disposed in a same layer as the plurality of shielding patterns, each row includes shielding connection structures arranged in the first direction; each row of shielding connection structures and portions of shielding patterns connected to the shielding connection structures in the row constitute a shielding connection strip;
   the display panel comprises a plurality of cathode connection strips, wherein an orthogonal projection of the shielding connection strip on the substrate covers an orthogonal projection of a respective cathode connection strip on the substrate.

4. The display panel according to claim 1, wherein the anode includes:
a first anode portion, a shape of the first anode portion being substantially the same as a shape of the active light-emitting area of the light-emitting device, and a border of the first anode portion being partially overlapped with a border of the anode; and
a second anode portion electrically connected to the first anode portion;
the cathode includes:
a first cathode portion, an orthogonal projection of the first cathode portion on the substrate being covered by an orthogonal projection of the first anode portion on the substrate; and
a second cathode portion electrically connected to the first cathode portion, an orthogonal projection of the second cathode portion on the substrate being covered by an orthogonal projection of the second anode portion on the substrate.

5. The display panel according to claim 4, further comprising: a pixel circuit layer, a second insulating layer, a connection wire layer and a third insulating layer that are sequentially arranged in a direction perpendicular to the substrate and pointing from the substrate to the anode, and are disposed between the substrate and a film layer where the plurality of anodes are located, wherein
the pixel circuit layer includes a plurality of first pixel circuits disposed at the periphery of the light-transmissive area;
a plurality of second via holes are provided in the second insulating layer, and a plurality of third via holes are provided in the third insulating layer; and
the connection wire layer includes a plurality of connection wires, a first end of each connection wire is electrically connected to a respective first pixel circuit through a respective second via hole, and a second end of the connection wire is electrically connected to a second anode portion of a respective anode through a respective third via hole.

6. The display panel according to claim 5, wherein the connection wire layer further includes a plurality of pads, each pad is electrically connected to a second end of a respective connection wire, and each pad is electrically connected to a second anode portion of a respective anode through a respective third via hole.

7. A display apparatus, comprising:
the display panel according to claim 1; and
a functional device disposed on a back side of the display panel and located in the light-transmissive area of the display panel.

8. A method for manufacturing a display panel, the method comprising:
fabricating a plurality of shielding patterns separated from each other on a substrate;
fabricating a plurality of light-emitting layers on a side of the plurality of shielding patterns away from the substrate;
fabricating a cathode film on a side of the plurality of light-emitting layers away from the substrate;
irradiating an area of the substrate corresponding to a light-transmissive area of the display panel from a side of the substrate away from the cathode film by using a laser beam to remove portions that are not shielded by the plurality of shielding patterns in a portion of the cathode film located in the area, so as to form a plurality of cathodes separated from each other, wherein each light-emitting layer and a respective cathode form a portion of a light-emitting device, the light-emitting device has an active light-emitting area, and an orthogonal projection of the active light-emitting area on the substrate is located within an orthogonal projection of the cathode on the substrate; and
fabricating at least one cathode connection structure made of a same material as the cathode and disposed in a same layer as the cathode, wherein
fabricating the plurality of shielding patterns separated from each other on the substrate, includes fabricating a plurality of anodes separated from each other on the substrate, an anode being as a shielding pattern;
a dimension of the cathode connection structure in a first direction is greater than a dimension of the cathode connection structure in a second direction, wherein the first direction is a row direction in which a plurality of sub-pixels of the display panel are arranged, and the second direction is a column direction in which the plurality of sub-pixels of the display panel are arranged;
each cathode connection structure is electrically connected to two cathodes adjacent to the cathode connection structure;
the at least one cathode connection structure includes a plurality of cathode connection structures arranged in a plurality of rows, and each row includes cathode connection structures arranged in the first direction; and
each row of cathode connection structures and portions of cathodes connected to the cathode connection structures in the row constitute a cathode connection strip; and in the second direction, the cathode connection strip has substantially a same dimension as each cathode connection structure.

9. A display panel having a display area including a light-transmissive area and a main display area located at a periphery of the light-transmissive area, the display panel comprising:
a substrate;
a plurality of shielding patterns disposed on the substrate and located in the light-transmissive area, orthogonal projections of the plurality of shielding patterns on the substrate being separated from each other;
a plurality of light-emitting layers disposed in the light-transmissive area and on the substrate;
a plurality of cathodes disposed in the light-transmissive area and located on a side of the plurality of light-emitting layers away from the substrate; each light-emitting layer and a respective cathode constituting a portion of a light-emitting device, the light-emitting device having an active light-emitting area, and an orthogonal projection of the active light-emitting area on the substrate being located within an orthogonal projection of a cathode of the light-emitting device on the substrate;
a plurality of anodes disposed in the light-transmissive area and located on a side of the plurality of light-emitting layers proximate to the substrate; and
at least one cathode connection structure made of a same material as the cathode and disposed in a same layer as the cathode, wherein
the cathode is located at a side of a respective shielding pattern away from the substrate, and an orthogonal projection of the shielding pattern on the substrate covers the orthogonal projection of the cathode on the substrate;
the plurality of shielding patterns are located at a side of the plurality of anodes proximate to the substrate;

the orthogonal projection of the shielding pattern on the substrate is at least partially overlapped with an orthogonal projection of a respective anode on the substrate;

a dimension of the cathode connection structure in a first direction is greater than a dimension of the cathode connection structure in a second direction, wherein the first direction is a row direction in which a plurality of sub-pixels of the display panel are arranged, and the second direction is a column direction in which the plurality of sub-pixels of the display panel are arranged;

each cathode connection structure is electrically connected to two cathodes adjacent to the cathode connection structure;

the at least one cathode connection structure includes a plurality of cathode connection structures arranged in a plurality of rows, and each row includes cathode connection structures arranged in the first direction; and each row of cathode connection structures and portions of cathodes connected to the cathode connection structures in the row constitute a cathode connection strip; and in the second direction, the cathode connection strip has substantially a same dimension as each cathode connection structure.

10. The display panel according to claim 9, further comprising:
a semiconductor layer located between the substrate and the plurality of anodes;
a gate metal layer located between the substrate and the plurality of anodes; and
a source-drain metal layer farther away from the substrate than the semiconductor layer and the gate metal layer, and located on the side of the plurality of anodes proximate to the substrate, wherein
the shielding patterns are located in the semiconductor layer or the gate metal layer or the source-drain metal layer.

11. The display panel according to claim 9, wherein a transmittance of the shielding pattern to visible light is greater than a transmittance of the shielding pattern to infrared light; and
a thickness of the shielding pattern is greater than a thickness of the cathode.

12. The display panel according to claim 11, wherein a material of the cathode includes a magnesium-silver alloy, and a material of the shielding pattern includes silver.

13. The display panel according to claim 9, wherein the cathode includes:
a cathode body portion, the orthogonal projection of the anode on the substrate covering an orthogonal projection of the cathode body portion on the substrate; and
a cathode connection portion electrically connected to the cathode body portion, an orthogonal projection of the cathode connection portion on the substrate being not overlapped with the orthogonal projection of the anode on the substrate.

14. The display panel according to claim 13, wherein the shielding pattern includes:
a shielding pattern body portion, an orthogonal projection of the shielding pattern body portion on the substrate covering the orthogonal projection of the cathode body portion on the substrate; and
a shielding pattern connection portion connected to the shielding pattern body portion, an orthogonal projection of the shielding pattern connection portion on the substrate covering the orthogonal projection of the cathode connection portion on the substrate.

15. The display panel according to claim 13, further comprising:
a transparent conductive layer located between a film layer in which the plurality of shielding patterns are located and the plurality of anodes; and
a first insulating layer located between the transparent conductive layer and the plurality of cathodes, wherein
a plurality of first via holes are provided in the first insulating layer; a gap exists between an orthogonal projection of each first via hole on the substrate and an orthogonal projection of an adjacent anode on the substrate, and the orthogonal projection of the first via hole on the substrate is located within an orthogonal projection of a respective cathode connection portion on the substrate; and each cathode is electrically connected to the transparent conductive layer through at least one first via hole.

16. The display panel according to claim 9, further comprising:
a plurality of shielding connection structures arranged in a plurality of rows, wherein the plurality of shielding connection structures are made of a same material as the plurality of shielding patterns and disposed in a same layer as the plurality of shielding patterns, each row includes shielding connection structures arranged in the first direction; each row of shielding connection structures and portions of shielding patterns connected to the shielding connection structures in the row constitute a shielding connection strip;
the display panel comprises a plurality of cathode connection strips, wherein an orthogonal projection of the shielding connection strip on the substrate covers an orthogonal projection of a respective cathode connection strip on the substrate.

17. The display panel according to claim 9, wherein the anode includes:
a first anode portion, a shape of the first anode portion being substantially the same as a shape of the active light-emitting area of the light-emitting device, and a border of the first anode portion being partially overlapped with a border of the anode; and
a second anode portion electrically connected to the first anode portion;
the cathode includes:
a first cathode portion, an orthogonal projection of the first cathode portion on the substrate being covered by an orthogonal projection of the first anode portion on the substrate; and
a second cathode portion electrically connected to the first cathode portion, an orthogonal projection of the second cathode portion on the substrate being covered by an orthogonal projection of the second anode portion on the substrate.

18. The display panel according to claim 17, further comprising: a pixel circuit layer, a second insulating layer, a connection wire layer and a third insulating layer that are sequentially arranged in a direction perpendicular to the substrate and pointing from the substrate to the anode, and are disposed between the substrate and a film layer where the plurality of anodes are located, wherein
the pixel circuit layer includes a plurality of first pixel circuits disposed at the periphery of the light-transmissive area;

a plurality of second via holes are provided in the second insulating layer, and a plurality of third via holes are provided in the third insulating layer; and the connection wire layer includes a plurality of connection wires, a first end of each connection wire is electrically connected to a respective first pixel circuit through a respective second via hole, and a second end of the connection wire is electrically connected to a second anode portion of a respective anode through a respective third via hole.

19. A method for manufacturing the display panel according to claim 9, the method comprising:

providing the substrate;

fabricating the plurality of shielding patterns separated from each other on the substrate;

fabricating the plurality of light-emitting layers on a side of the plurality of shielding patterns away from the substrate;

fabricating a cathode film on the side of the plurality of light-emitting layers away from the substrate;

irradiating an area of the substrate corresponding to the light-transmissive area of the display panel from a side of the substrate away from the cathode film by using a laser beam to remove portions that are not shielded by the plurality of shielding patterns in a portion of the cathode film located in the area, so as to form the plurality of cathodes separated from each other, wherein each light-emitting layer and the respective cathode form the portion of the light-emitting device, the light-emitting device has the active light-emitting area, and the orthogonal projection of the active light-emitting area on the substrate is located within the orthogonal projection of the cathode on the substrate; and fabricating the at least one cathode connection structure made of the same material as the cathode and disposed in the same layer as the cathode, wherein fabricating the plurality of shielding patterns separated from each other on the substrate, includes:

fabricating a patterned semiconductor layer, a patterned gate metal layer and a patterned source-drain metal layer on the substrate, wherein the source-drain metal layer is farther away from the substrate than the semiconductor layer and the gate metal layer; and forming the plurality of shielding patterns in a process of forming the patterned semiconductor layer or gate metal layer or source-drain metal layer;

after fabricating the plurality of shielding patterns separated from each other on the substrate and before fabricating the plurality of light-emitting layers, the method further comprises:

fabricating the plurality of anodes, each light-emitting device including a respective anode of the plurality of anodes;

the dimension of the cathode connection structure in the first direction is greater than the dimension of the cathode connection structure in the second direction, wherein the first direction is the row direction in which the plurality of sub-pixels of the display panel are arranged, and the second direction is the column direction in which the plurality of sub-pixels of the display panel are arranged;

each cathode connection structure is electrically connected to the two cathodes adjacent to the cathode connection structure;

the at least one cathode connection structure includes the plurality of cathode connection structures arranged in the plurality of rows, and each row includes the cathode connection structures arranged in the first direction; and each row of cathode connection structures and the portions of cathodes connected to the cathode connection structures in the row constitute the cathode connection strip; and in the second direction, the cathode connection strip has substantially the same dimension as each cathode connection structure.

20. A display apparatus, comprising:

the display panel according to claim 9; and a functional device disposed on a back side of the display panel and located in the light-transmissive area of the display panel.

* * * * *